US012706438B2

(12) United States Patent
Sergyeyenko et al.

(10) Patent No.: US 12,706,438 B2
(45) Date of Patent: Aug. 11, 2026

(54) LASER LEVEL COOLING

(71) Applicant: Stanley Black & Decker Inc., New Britain, CT (US)

(72) Inventors: Oleksiy P. Sergyeyenko, Baldwin, MD (US); Jia Yong Jiang, Suzhou (CN); Steven J. Phillips, Ellicott City, MD (US); Michael C. Schmittdiel, Baltimore, MD (US); Devansh K. Jhawar, Baltimore, MD (US); Akash Agarwal, Baltimore, MD (US); Jb Ring, Vienna, VA (US); Sukrutkumar Babasaheb Bhandare, Timonium, MD (US); Jose Guadalupe Ramirez, Owings Mills, MD (US); Alexander J. Morgan, Jarrettsville, MD (US); Daniel J. White, Baldwin, MD (US); Prathamesh S. Desai, Towson, MD (US); Sergey Galitskiy, Rockville Vernon, CT (US); Yen-Ting Lai, Taichung City (TW); Po Hsien Tung, Taichung City (TW)

(73) Assignee: STANLEY BLACK & DECKER INC., New Britain, CT (US)

( * ) Notice: Subject to any disclaimer, the term of this patent is extended or adjusted under 35 U.S.C. 154(b) by 433 days.

(21) Appl. No.: 18/227,762

(22) Filed: Jul. 28, 2023

(65) Prior Publication Data

US 2024/0039238 A1 Feb. 1, 2024

Related U.S. Application Data

(60) Provisional application No. 63/510,457, filed on Jun. 27, 2023, provisional application No. 63/393,704, (Continued)

(51) Int. Cl.
*H01S 5/024* (2006.01)
*F25B 21/02* (2006.01)
*G01C 15/00* (2006.01)

(52) U.S. Cl.
CPC .......... *H01S 5/02469* (2013.01); *F25B 21/02* (2013.01); *G01C 15/004* (2013.01); *H01S 5/02415* (2013.01); *F25B 2321/023* (2013.01)

(58) Field of Classification Search
CPC .. G01C 15/004; H05K 7/202; H05K 7/20172; H05K 7/20145; H01S 5/02415
(Continued)

(56) References Cited

U.S. PATENT DOCUMENTS 3,339,150 A 8/1967 Colin
4,221,483 A 9/1980 Rando
(Continued)

FOREIGN PATENT DOCUMENTS

CN 203734130 7/2014
CN 204188810 3/2015
(Continued)

OTHER PUBLICATIONS

International Search Report mailed Jan. 4, 2024 in corresponding PCT Application No. PCT/US2023/028824, 5 pages.

*Primary Examiner* — Peter J Macchiarolo
*Assistant Examiner* — Anna Josephine Saunders
(74) *Attorney, Agent, or Firm* — Womble Bond Dickinson (US) LLP

(57) ABSTRACT

A construction laser level including a housing, a laser mount disposed in the housing and at least one laser generator on the laser mount. The laser mount includes a plurality of heat dissipating fins.

20 Claims, 19 Drawing Sheets

Related U.S. Application Data filed on Jul. 29, 2022, provisional application No. 63/393,229, filed on Jul. 28, 2022.

(58) Field of Classification Search
USPC .................................... 33/286, 290; 165/185
See application file for complete search history.

(56) References Cited

U.S. PATENT DOCUMENTS

| | | | | |
|---|---|---|---|---|
| 4,722,599 | A | 2/1988 | Fruengel et al. | |
| 5,745,623 | A | 4/1998 | Ohtomo et al. | |
| 6,048,105 | A | 4/2000 | Ohtomo et al. | |
| 6,307,871 | B1 | 10/2001 | Heberle | |
| 6,351,478 | B1 | 2/2002 | Heberle | |
| 6,517,221 | B1 * | 2/2003 | Xie | F28D 15/0266 362/373 |
| 6,570,895 | B2 | 5/2003 | Heberle | |
| 6,697,399 | B2 * | 2/2004 | Kimura | H01S 5/02212 257/706 |
| 7,123,635 | B2 * | 10/2006 | Tamaki | H01S 3/042 372/34 |
| 7,305,016 | B2 * | 12/2007 | Stephens, IV | H01S 5/02423 372/34 |
| 7,392,592 | B2 * | 7/2008 | Bublitz | G01C 15/004 33/290 |
| 7,395,604 | B2 * | 7/2008 | Chien | G01C 15/004 33/290 |
| 7,466,732 | B2 | 12/2008 | Stephens, IV | |
| 7,532,652 | B2 * | 5/2009 | Vetrovec | F41H 13/005 372/90 |
| 7,995,834 | B1 * | 8/2011 | Knighton | G06V 10/12 250/234 |
| 8,179,936 | B2 * | 5/2012 | Bueche | H01S 3/042 372/55 |
| 8,208,510 | B2 | 6/2012 | Kawanishi et al. | |
| 8,699,007 | B2 | 4/2014 | Becker et al. | |
| 8,705,012 | B2 | 4/2014 | Greiner et al. | |
| 8,730,477 | B2 * | 5/2014 | Ruhland | G01S 17/42 356/402 |
| 10,036,811 | B2 * | 7/2018 | Böckem | G01S 17/66 |
| 10,591,296 | B2 * | 3/2020 | Kwan | G01C 15/105 |
| 11,025,034 | B2 * | 6/2021 | Hodges | F28F 3/12 |
| 11,520,013 | B2 * | 12/2022 | Hattass | G01S 17/42 |
| 2003/0198264 | A1 * | 10/2003 | Vetrovec | H01S 3/042 372/35 |
| 2006/0083276 | A1 * | 4/2006 | Brown | H01S 3/042 372/36 |
| 2006/0272167 | A1 * | 12/2006 | Chien | G01C 15/004 33/286 |
| 2007/0297469 | A1 | 12/2007 | Brown | |
| 2010/0309940 | A1 * | 12/2010 | Lee | F28D 15/0233 165/185 |
| 2016/0254642 | A1 * | 9/2016 | Takigawa | H01S 5/02469 372/34 |
| 2019/0273421 | A1 * | 9/2019 | Velderman | H02K 5/18 |
| 2021/0190491 | A1 * | 6/2021 | Khan | G01C 15/004 |
| 2022/0299608 | A1 * | 9/2022 | Allouis | G01S 7/4813 |
| 2022/0329048 | A1 * | 10/2022 | Kotovsky | H01S 5/4025 |
| 2023/0345679 | A1 * | 10/2023 | Wang | H05K 7/209 |
| 2024/0039238 | A1 * | 2/2024 | Sergyeyenko | H01S 5/02469 |
| 2025/0113463 | A1 * | 4/2025 | Sergyeyenko | G01C 15/004 |

FOREIGN PATENT DOCUMENTS

| | | | |
|---|---|---|---|
| CN | 108426569 | | 8/2018 |
| CN | 209401978 | | 9/2019 |
| CN | 209571687 | | 11/2019 |
| CN | 110749312 | A | 2/2020 |
| CN | 210181222 | U | 3/2020 |
| CN | 210323351 | U | 4/2020 |
| CN | 210742502 | U | 6/2020 |
| CN | 210774006 | U | 6/2020 |
| CN | 211205291 | | 8/2020 |
| CN | 212207679 | U | 12/2020 |
| CN | 212378739 | U | 1/2021 |
| CN | 212585705 | U | 2/2021 |
| CN | 213543571 | | 6/2021 |
| CN | 213688294 | U | 7/2021 |
| CN | 213812290 | | 7/2021 |
| CN | 215177750 | U | 12/2021 |
| CN | 215261739 | | 12/2021 |
| CN | 215526117 | U | 1/2022 |
| CN | 215867122 | U | 2/2022 |
| CN | 216450388 | | 5/2022 |
| CN | 216624855 | U | 5/2022 |
| CN | 111487634 | B | 7/2022 |
| CN | 217331147 | U | 8/2022 |
| CN | 115218532 | A | 10/2022 |
| CN | 219064515 | | 5/2023 |
| CN | 116222495 | | 6/2023 |
| DE | 102010042654 | | 4/2012 |
| WO | 2012013279 | | 2/2012 |
| WO | 2016037723 | | 3/2016 |
| WO | 2021168787 | A1 | 9/2021 |

* cited by examiner 510
2100
170

2000
2013
2016
2010
2011
510
170
170
2015
2014

LASER LEVEL COOLING

CROSS REFERENCE TO RELATED APPLICATIONS

This application claims the benefit of and priority to U.S. Provisional Patent Application No. 63/393,229, filed Jul. 28, 2022, titled "LASER LEVEL COOLING," and claims the benefit of and priority to U.S. Provisional Patent Application No. 63/393,704, filed Jul. 29, 2022, titled "LASER LEVEL COOLING," and claims the benefit of and priority to U.S. Provisional Patent Application No. 63/510,457, filed Jun. 27, 2023, titled "LASER LEVEL COOLING," and claims priority to International Application No. PCT/US23/28824 filed Jul. 27, 2023, titled "LASER LEVEL COOLING", which are herein incorporated by reference in their entireties.

FIELD OF THE INVENTION

The present disclosure relates to an improved laser line generating device for assisting with construction layout tasks.

BACKGROUND

Laser line generators are commonly used for construction layout. For example, laser line generators may be used to partition an open space in a commercial building into useable office areas. In this example, the construction laser level generates squared lines on a floor which are in turn used to construct walls or cubicles. At some later time, it may be desirable to transfer the squared lines from the floor to the ceiling or from the ceiling to the floor. In other instances, it may be desirable to generate squared lines on the ceiling and floor simultaneously. A construction laser level instrument, used in the construction trades, may utilize a laser generator that generates a laser beam and may project one or more of a laser spot and a laser line. It is desired to provide an improved construction laser level for assisting with construction layout tasks.

FIGS. 1-3 illustrate a prior art laser level construction. The laser level of FIGS. 1-3 is a 3×360 laser level projecting two perpendicular vertical lines and one horizontal line. Laser diodes are provided in the laser level to produce the laser beams. The laser diodes are a source of heat and are mounted inside brass barrels that may act as a heatsink. The brass barrel is mounted to an aluminum mounting component, which sets the multiple laser lines perpendicular to each other. This laser mount also may also act as a heat sink. The laser mount may also contain other passive optical components such as lenses, beamsplitters, or mirrors. The laser mount is suspended on a gimbal mechanism or frame, which limits heat transfer from the laser diodes to the gimbal frame The gimbal mechanism including the laser mount is contained inside fully enclosed, housing. The plastic housing is a solid housing without vents and so does not provide air exchange with the outside ambient air.

This section provides background information related to the present disclosure which is not necessarily prior art.

SUMMARY

According to an aspect, an example embodiment of a construction laser level, includes: a housing; a laser mount disposed in the housing; at least one laser generator associated with the laser mount; wherein the laser mount includes a plurality of heat dissipating fins.

The laser mount may be passively leveled.

The laser mount may be actively leveled.

The laser mount may include at least three heat dissipating fins.

The laser mount may include at least six heat dissipating fins.

The plurality of heat dissipating fins may include a first set of heat dissipating fins projecting in a first direction and a second set of heat dissipating fins projecting in a second direction.

The first direction may be transverse to the second direction.

The first set of heat dissipating fins may include at least three heat dissipating fins.

The construction laser level the second set of heat dissipating fins may include at least three heat dissipating fins.

The plurality of heat dissipating fins may include a first set of heat dissipating fins projecting in a first direction, a second set of heat dissipating fins projecting in a second direction and a third set of heat dissipating fins projecting in a third direction.

The laser mount may include metal.

The laser mount may include aluminum.

The at least one laser generator associated with the laser mount may include at least three laser generators.

Each of the at least three laser generators may include a laser diode.

Each of the at least three laser generators may include a diode-pumped solid-state laser.

The construction laser level may be a cross-line laser level.

The construction laser level may be a 1×360 laser level.

The construction laser level may be a 2×360 laser level.

The construction laser level may be a 3×360 laser level.

The construction laser level may be a 4×360 laser level.

The laser mount may be passively leveled by gravity.

The laser mount may be actively leveled.

The laser mount may be actively leveled by at least one motor.

The construction laser level may include at least one sensor and an orientation is determined at least in part based on the at least one sensor. The determined orientation may be an orientation of at least one of the laser mount and the at least one laser generator. The construction laser level may include a controller. The controller may be configured to receive information from the sensor and control the at least one motor.

The at least one laser generator may produce laser beams with an optical power of at least 1 mW.

The at least one laser generator may produce laser beams with an optical power of at least 4 mW.

The at least one laser generator may produce laser beams with an optical power of at least 6 mW.

The at least one laser generator may produce laser beams with an optical power of at least 8 mW.

The at least one laser generator may produce laser beams with an optical power of at least 10 mW.

The at least one laser generator may produce laser beams with an optical power of less than 20 mW.

The at least one laser generator may produce laser beams with an optical power of less than 18 mW.

The at least one laser generator may produce laser beams with an optical power of less than 16 mW.

According to an aspect of an example embodiment, a construction laser level includes: a housing; a laser mount disposed in the housing; a laser generator on the laser mount, wherein the laser generator is configured to project a laser beam outside of the housing; and a fan configured to circulate air in an interior of the housing.

The laser beam may include a laser line.

The housing may be substantially air-tight.

The fan may be disposed within the housing.

The fan may provide a rated air flow of at least 0.5 cubic feet per minute (cfm); at least 1 cubic foot per minute; at least 2 cubic feet per minute; at least 3 cubic feet per minute; at least 4 cubic feet per minute; at least 5 cubic feet per minute; at least 6 cubic feet per minute; at least 7 cubic feet per minute; at least 8 cubic feet per minute; at least 9 cubic feet per minute; at least 10 cubic feet per minute; at least 11 cubic feet per minute; or at least 12 cubic feet per minute. The fan may provide a rated airflow of less than 30 cubic feet per minute (cfm); less than 25 cubic feet per minute (cfm) or less than 20 cubic feet per minute (cfm).

The fan may provide a rated air flow in a range of 2 to 5 cubic feet per minute; a range of 2.5 to 4.5 cubic feet per minute; or a range of 3 to 4 cubic feet per minute.

According to an aspect, an example embodiment of a construction laser level includes: a housing; a laser mount disposed in the housing; and a laser generator on the laser mount. The laser generator may be configured to project a laser beam outside of the housing. The laser level may further include a fan configured to circulate air within the housing and from within the housing to outside the housing.

The fan may provide a rated air flow of at least 5 cubic feet per minute; at least 6 cubic feet per minute; at least 7 cubic feet per minute; at least 8 cubic feet per minute; at least 9 cubic feet per minute; at least 10 cubic feet per minute; at least 11 cubic feet per minute; or at least 12 cubic feet per minute. The fan may provide a rated airflow of less than 30 cubic feet per minute (cfm); less than 25 cubic feet per minute (cfm) or less than 20 cubic feet per minute (cfm).

The fan may be disposed at least partially within the housing.

The fan may be disposed at least partially outside the housing.

The fan may be disposed at least partially within the housing and at least partially outside the housing.

The construction laser level may further include a fan enclosure.

The fan enclosure may substantially surround the portion of the fan disposed at least partially outside of the housing.

The fan enclosure may be configured to allow air to flow from inside the fan enclosure to outside the fan enclosure.

The fan enclosure may be air permeable.

The fan enclosure may include vents.

The housing may be substantially airtight.

According to an aspect, an example embodiment of a construction laser level includes: a primary housing; a laser mount disposed in the primary housing; and a laser generator within the laser mount. The laser generator may be configured to project a laser beam outside of the primary housing. The construction laser level may further include a thermoelectric cooler. The thermoelectric cooler may be configured to dissipate heat from inside the housing.

A first portion of the thermoelectric cooler may be inside the primary housing and a second portion of the thermoelectric cooler may be outside the primary housing.

The thermoelectric cooler may include a plurality of fins.

The thermoelectric cooler may include a plurality of fins inside the primary housing.

The thermoelectric cooler may include a plurality of fins outside the primary housing.

The plurality of fins may be parallel to one another.

A first portion of the thermoelectric cooler may face an inside of the primary housing and a second portion of the thermoelectric cooler faces an outside of the housing.

The construction laser level may further include a secondary housing, the secondary housing surrounding at least a portion of the thermoelectric cooler.

The secondary housing may include vents configured to allow air to flow from inside the secondary housing to outside the secondary housing.

The construction laser level may further include a fan.

The fan may be disposed in the primary housing.

The fan may be disposed in a secondary housing.

The fan may be disposed partially in the primary housing.

The fan may be disposed partially in a secondary housing.

The fan may be disposed partially in the primary housing and partially in a secondary housing.

According to an aspect of an example embodiment, a construction laser level includes: a housing; a laser mount disposed in the primary housing; and a laser generator associated with the laser mount. The laser generator may be configured to project a laser beam outside of the primary housing. The construction laser level may further include a port in the primary housing for injecting a fluid into the housing.

The fluid may be a gas.

The gas may be carbon dioxide.

The fluid may be a liquid.

The fluid may include at least one of carbon dioxide, nitrogen, argon, helium and neon.

The construction laser level may further include an exhaust valve configured to release fluid from inside the housing.

According to an aspect of an example embodiment, a construction laser level includes: a housing; a laser mount disposed in the housing; and at least one laser generator associated with the laser mount. The housing may include a plurality of heat dissipating fins.

The housing may include at least three heat dissipating fins.

The housing may include at least six heat dissipating fins.

The plurality of heat dissipating fins may include a first set of heat dissipating fins projecting in a first direction and a second set of heat dissipating fins projecting in a second direction.

The first direction may be transverse to the second direction.

The first set of heat dissipating fins may include at least three heat dissipating fins.

The second set of heat dissipating fins may include at least three heat dissipating fins.

The plurality of heat dissipating fins may include a first set of heat dissipating fins projecting in a first direction, a second set of heat dissipating fins projecting in a second direction, and a third set of heat dissipating fins projecting in a third direction.

The laser mount may include metal.

The laser mount may include aluminum.

The least one laser generator associated with the laser mount may include at least three laser generators.

Each of the at least three laser generators may include a laser diode.

Each of the at least three laser generators may include a diode-pumped solid-state laser.

The construction laser level may be a cross-line laser level.

The construction laser level may be a 3×360 laser level.

The plurality of heat dissipating fins may include a first set of heat dissipating extending outwardly from the housing.

The plurality of heat dissipating fins may include a second set of heat dissipating extending inwardly from the housing.

At least some of the plurality of heat dissipating fins may include metal.

At least some of the plurality of heat dissipating fins may include plastic.

The laser mount may include a conductive material with a conductivity greater than 5 W/(mK).

The laser mount may include a conductive material with a conductivity greater than 10 W/(mK).

The heat dissipating projections or fins may include a conductive material with a conductivity greater than 5 W/(mK).

The heat dissipating projections or fins may include a conductive material with a conductivity greater than 10 W/(mK).

The heat dissipating projections or fins may project at least 2 mm, at least 3 mm, at least 4 mm, at least 5 mm, at least 6 mm, at least 7 mm, at least 8 mm, at least 9 mm, or at least 10 mm. The heat dissipating projections or fins may projects less than 40 mm, less than 35 mm, less than 30 mm or less than 25 mm.

The heat dissipating projections or fins may include a composite material.

The laser mount may be passively leveled by gravity.

The laser mount may be actively leveled.

The laser mount may be actively leveled by one or more motors.

The laser mount may be a passively leveled pendulum.

Various features of the above aspects of example embodiments may be combined or substituted for one another.

BRIEF DESCRIPTION OF THE DRAWINGS

Example embodiments of the present application are described with reference to and in conjunction with the accompanying drawings, in which.

DETAILED DESCRIPTION OF EXEMPLARY EMBODIMENTS

The drawings are for the purpose of illustration and description only and are not intended as a definition of the limits of the invention. In addition, it should be appreciated that structural features shown or described in any one embodiment herein can be used in other embodiments as well. As used in the specification and in the claims, the singular form of "a", "an", and "the" include plural referents unless the context clearly dictates otherwise.

All closed-ended (e.g., between A and B) and open-ended (greater than C) ranges of values disclosed herein explicitly include all ranges that fall within or nest within such ranges. For example, a disclosed range of 1-10 is understood as also disclosing, among other ranged, 2-10, 1-9, 3-9, etc.

As used herein, the terminology "at least one of A, B and C" and "at least one of A, B and C" each mean any one of A, B or C or any combination of A, B and C. For example, at least one of A, B and C may include only A, only B, only C, A and B, A and C, B and C, or A, B and C.

Figure 1:
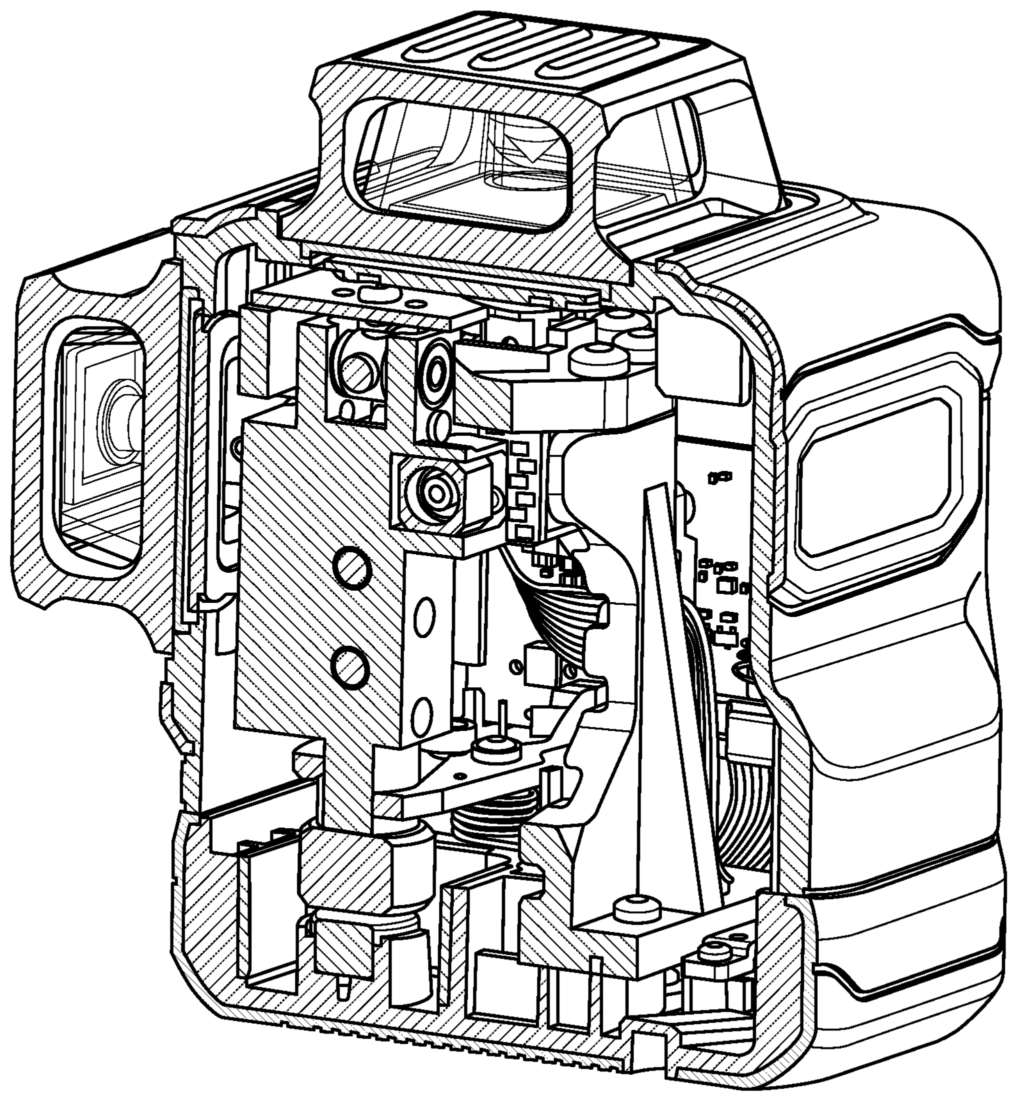
FIG. 1 is a cross-sectional view of a laser level.
Figure 2:
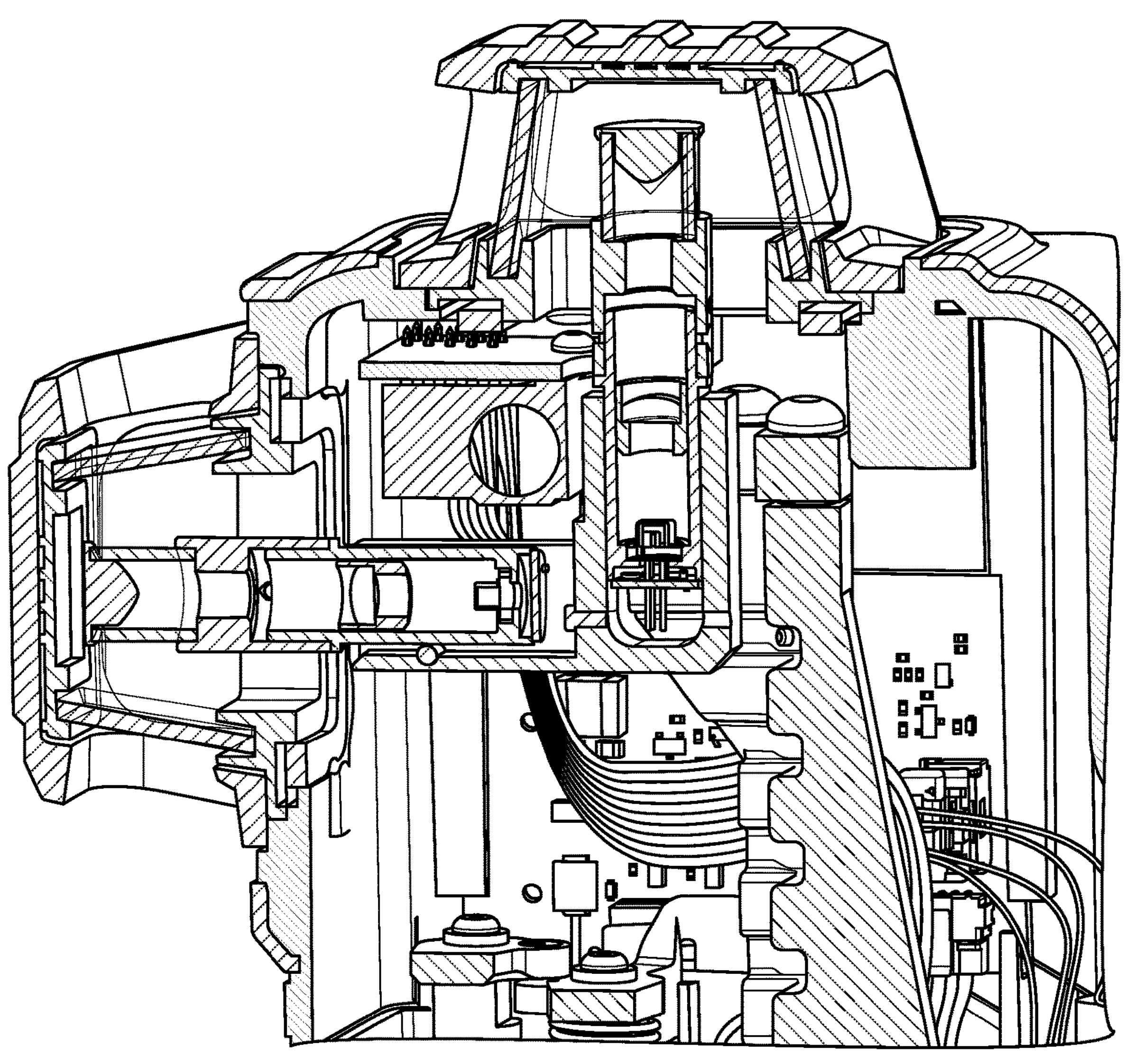
FIG. 2 is a cross-sectional view of a laser level.
Figure 3:
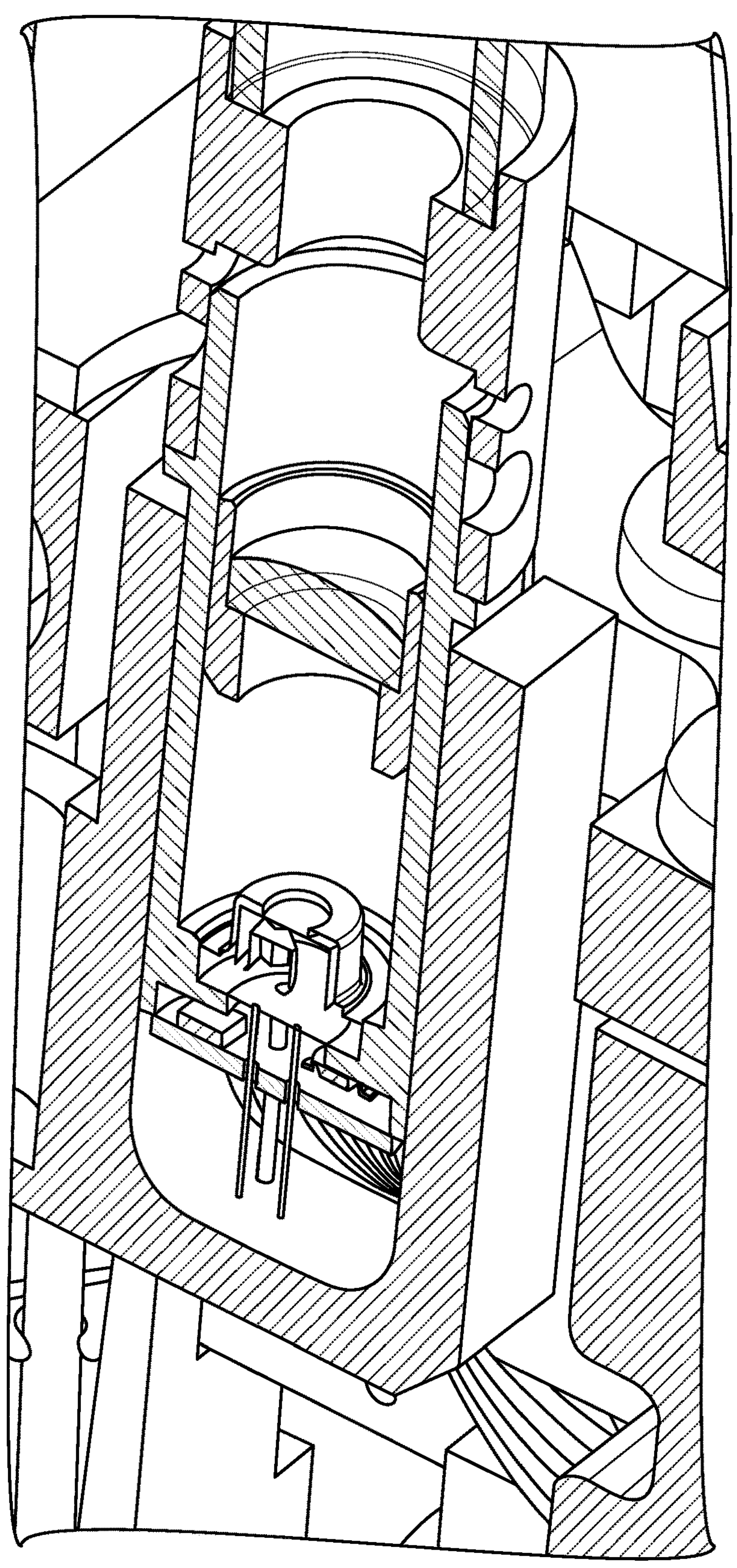
FIG. 3 is a cross-sectional view of a laser diode assembly of a laser level.
Figure 4:
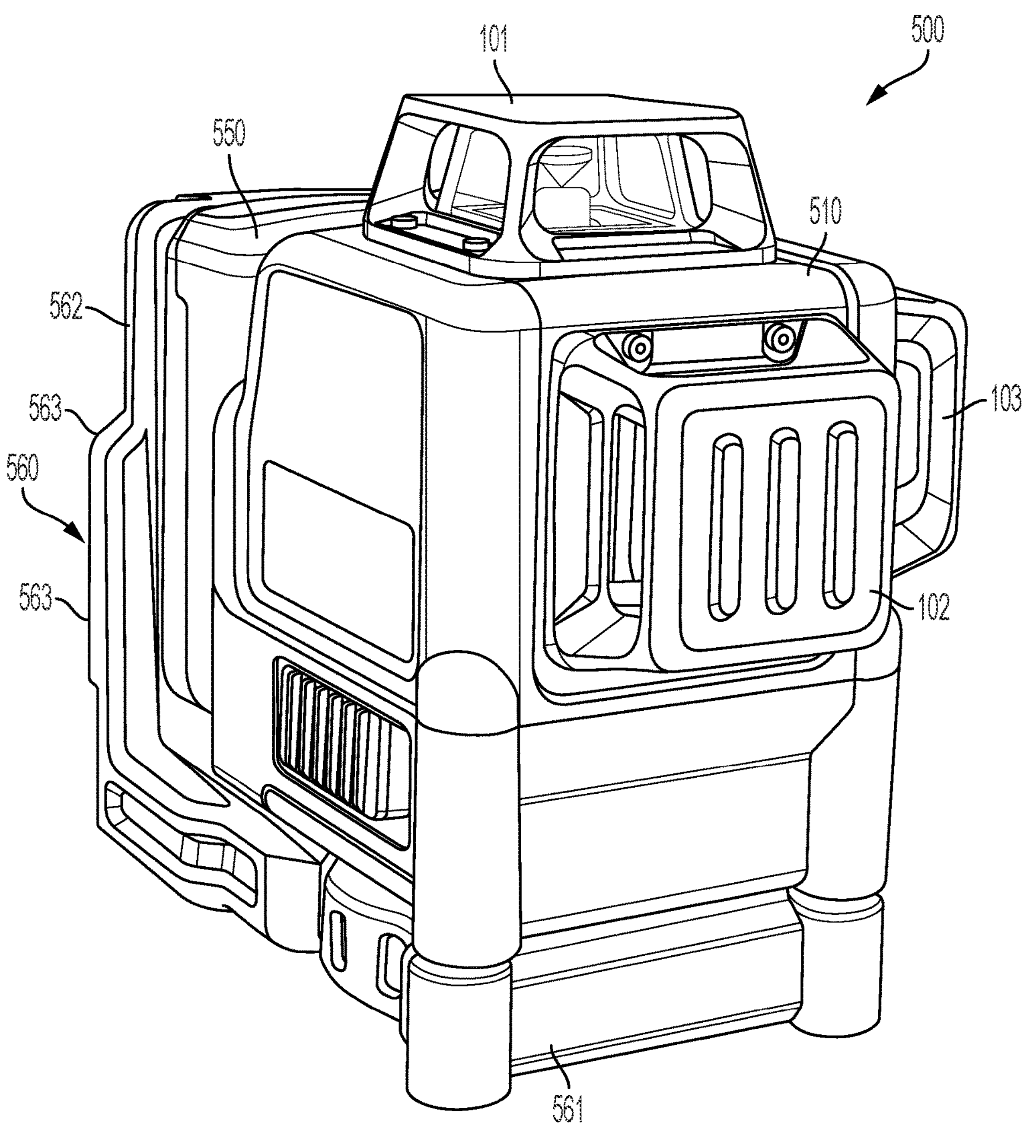
FIG. 4 is a perspective view of an example embodiment of a laser level.
Figure 5:
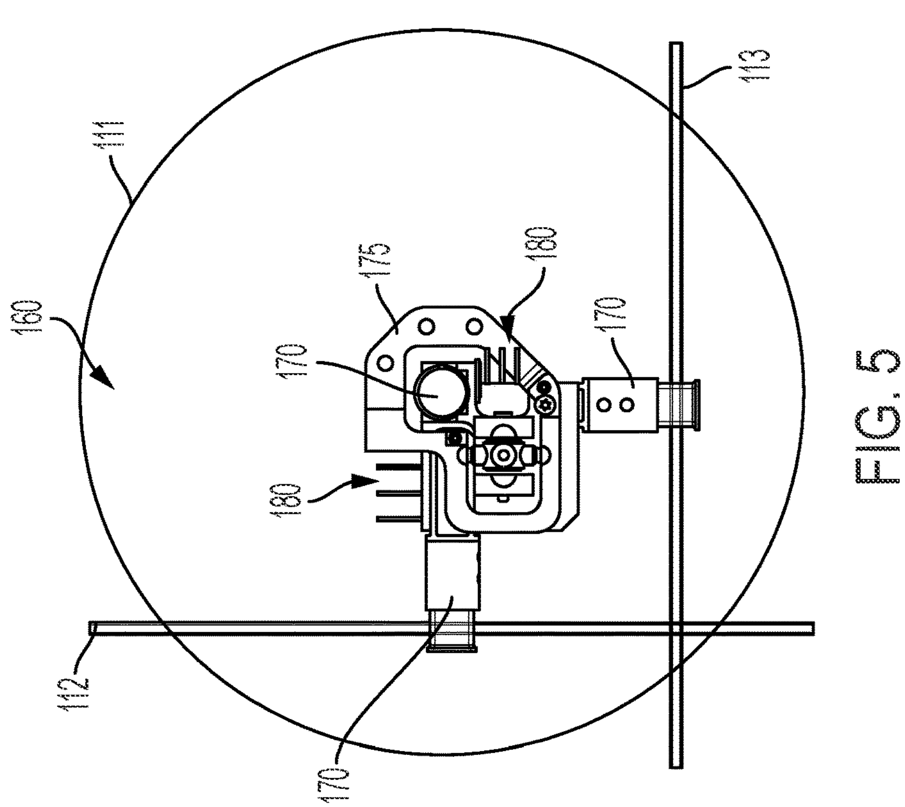
FIG. 5 is a top view of an example embodiment of a laser module assembly.

FIG. 4 illustrates a laser level 500. The laser level 500 is powered by a battery pack 550. As shown in FIGS. 4 and 5, the laser level 500 has a housing 510 and three laser projectors 101, 102, 103. The laser projectors 101, 102, 103 project the three laser lines. The battery pack 550 is connected to the housing 510 to provide power to laser generators which generate laser beams, and thus the three laser lines. The battery pack 550 may be a power tool battery pack and configure to power various power tools in addition to laser level 500. The battery pack 550 may also power various other components of a laser level, such as one or more motors or electronic components. There may also be a secondary power source for powering electronic components. The secondary power source may be an internal battery configured to power one or more electronic components.

The laser level 500 is mounted on a bracket 560 with a base portion 561 and a mounting portion 562. The laser level 500 is attached to the base 561. The mounting portion 562 of the bracket 560 may include two magnets 563. The magnets 563 allow the bracket 560 to be mounted to a metal beam or other metal surfaces. In the laser level 500 of FIG. 4, the battery pack 550 is mounted to the laser housing 510. In other embodiments, the battery pack 550 may be mounted to the bracket as shown in U.S. Patent Application Publication Number 2021/0190491, which is hereby incorporated by reference. The battery pack 550 may be mounted to various locations of the bracket, such as a bottom of the bracket and may be mounted in a variety of manners. Additionally, the battery pack may be a different style battery pack from the slide pack shown in FIG. 4 or U.S. Patent Application Publication Number 2021/0190491.

Figure 6:
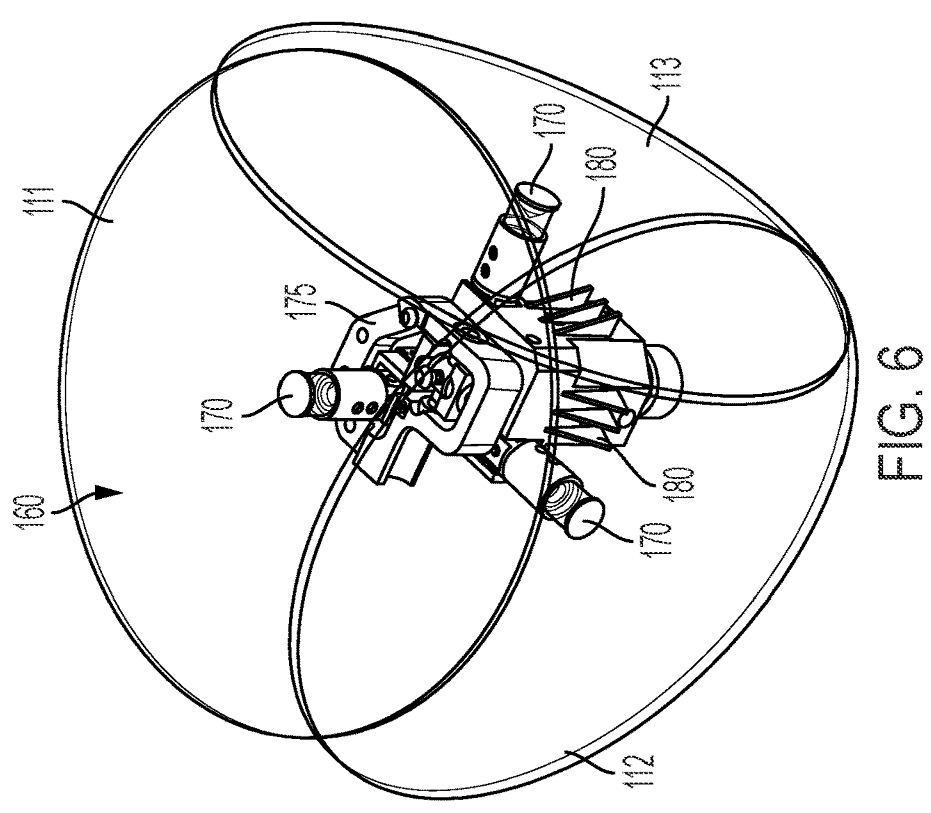
FIG. 6 is a perspective view of an example embodiment of a laser module assembly.

The laser level 500 includes three laser projectors 101, 102 and 103. The three laser projectors project three perpendicular laser beams. FIGS. 5 and 6 illustrate a laser module assembly 160 which produces the laser lines 111, 112 and 113 that project out of the three laser projectors 101, 102 and 103, respectively. The laser module assembly 160 is housed in the housing 510 of the laser level 500. The laser module assembly 160 includes three laser modules 170. The three laser modules 170 are carried on a laser mount 175 such that the laser modules move with the laser mount. In this embodiment, the laser mount may be a passively leveled pendulum 175, passively leveling itself with respect to gravity. In other example embodiments, the laser mount may be actively leveled such that, for example, one or more motors and sensors are utilized to orient the laser mount and laser modules as desired. An embodiment including an actively leveled laser mount may include a pendulum. An embodiment including an actively leveled laser mount may include a platform. In other embodiments, an actively leveled laser mount may not include a pendulum.

In the example embodiment, each laser module includes a laser generator such as a laser diode and a reflector such as a cone reflector. The laser generators may be diode-pumped solid-state lasers (DPSSL). The laser generator produces a laser beam which is reflected off the surface of the reflective cone to project laser lines 111, 112, and 113 at the three laser projectors 101, 102 and 103.

The laser generators may produce lasers with a wavelength in a range of, for example, 510 nano-meters (nm) to 570 nm; or 520 nm to 555 nm; or 530 nm to 540 nm. For example, the laser generators may produce laser beams in a wavelength of about 535 nm.

The lasers generators may produce laser beams with an optical power of greater than 0.5 mW, greater than 1 mW, greater than 2 mW, greater than 3 mW, greater than 4 mW, greater than 5 mW, greater than 6 mW, greater than 7 mW, greater than 8 mW, greater than 9 mW or greater than 10 mW. The laser generators may produce laser beams with an optical power output of less than 16 mW, less than 15 mW, less than 14 mW, less than 13 mW, less than 12 mW, less than 11 mW, less than 10 mW, less than 9 mW, less than 8 mW, less than 7 mW, or less than 6 mW. For example, in an example embodiment, a laser level may include laser generators that produce laser beams with an optical power that is in a range of 3 mW to 10 mW, 4 mW to 9 mW, or 5 mW to 8 mW. Optical power of the laser beams may be measured by IEC 60825, table 10, condition 3.

Laser generators may produce heat. As the optical power of the laser generator is increased, heat generated by the laser generator may correspondingly increase. The increased heat may damage components of the laser level 500. The increased heat may decrease optical power.

During the start-up of a laser level, as the laser generators are turned on, the optical power may varies with time if temperature increases. For example, the optical power may vary over time in a saw-tooth pattern including increases in optical power followed by decreases of optical power. The decreases in optical power may be less than the increases in optical power. The variations may continue in a saw-tooth pattern until a stable optical power is reached. In some instances, the variations may continue as the laser level is used. In some instances, for example if the temperature continues to increase, the decreases in optical power may be greater than the increase in optical power so that the optical power tends to decrease over time.

Various example embodiments of the present application may help to limit temperature, limit increases in temperature, and/or may limit the speed in changes of temperature, and so may limit damage to components or a decrease or changes in optical power due to temperature. For example, if the rate of change in temperature is limited, a change in optical power due to temperature may be limited or slowed so that a stable optical power output may be produced over time.

In the example embodiment of the laser level 500, the laser mount 175 rotates about a relatively small angle so that the laser modules 170 project beams in the horizontal and vertical planes when placed on a surface that is not entirely horizontally flat. For example, if the laser level 500 is placed on a surface that is sloped five degrees (5 degrees) with respect to horizontal, the laser mount 175 will tilt under the influence of gravity so that the laser modules 170 are aligned to produce a laser line 111 in a horizontal plane and laser lines 112 and 113 in vertical planes. Additionally, in some embodiments the laser level 500 includes a locking device to lock the laser mount 175. In those instances the laser mount 110 will be locked in a particular position rather than allowed to rotate under the influence of gravity and it may produce laser lines offset from the vertical and horizontal. In the example embodiment of FIGS. 5 and 6, the laser mount is a passively leveled laser mount. That is, the laser mount 175 is leveled under the influence of gravity. There may be dampening of the laser mount 175, such as magnetic dampening. In other example embodiments, a laser level may include an actively leveled laser mount. For example, U.S. Pat. No. 6,313,912 discloses a laser mount compensator for a laser leveling instrument which includes motors for providing leveling. U.S. Pat. No. 6,313,912 is hereby incorporated by reference in its entirety.

The laser lines 111, 112, 113 project out from the laser level 100 onto walls, floors ceilings or other surfaces. As there are three beams which project substantially 360 degrees, the laser level 500 is considered a 3×360 laser level. In other embodiments the laser level may have a fewer or greater number of laser lines projecting substantially 360 degrees. For example, the laser level may be a 1×360, 2×360, 4×360 or 5×360 laser level. When the laser level assembly 505 is attached to a vertical wall at the mounting portion 203, the laser level 500 produces two vertical laser lines and one horizontal laser line. Similarly, then the laser level assembly is placed on a flat horizontal surface, the laser level 500 produces two vertical laser lines and one horizontal laser line. In some instances, the laser level 500 may be considered to be located at a front of the laser level assembly 10 and the mounting portion 562 at the back of the laser level assembly 505.

Figure 8:
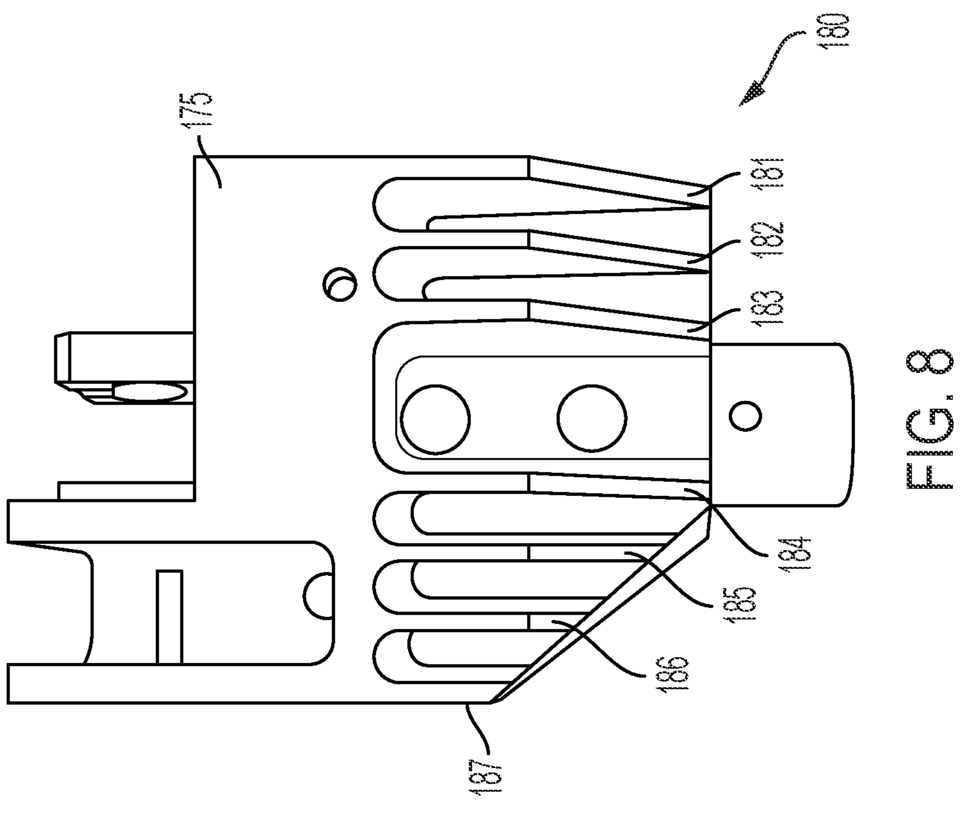
FIG. 8 is a second side view of an example embodiment of a laser mount.
Figure 7:
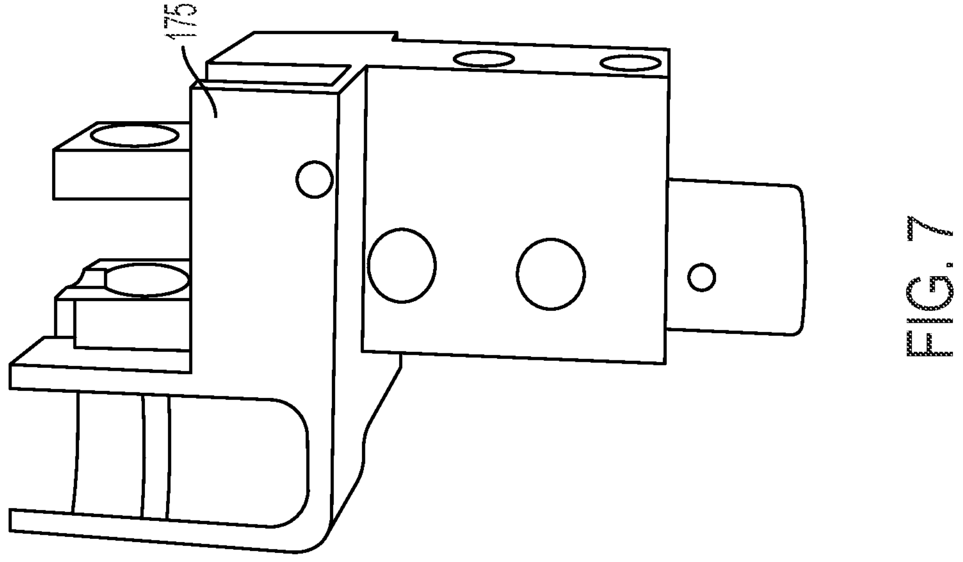
FIG. 7 is a first side view of an example embodiment of a laser mount.
Figure 10:
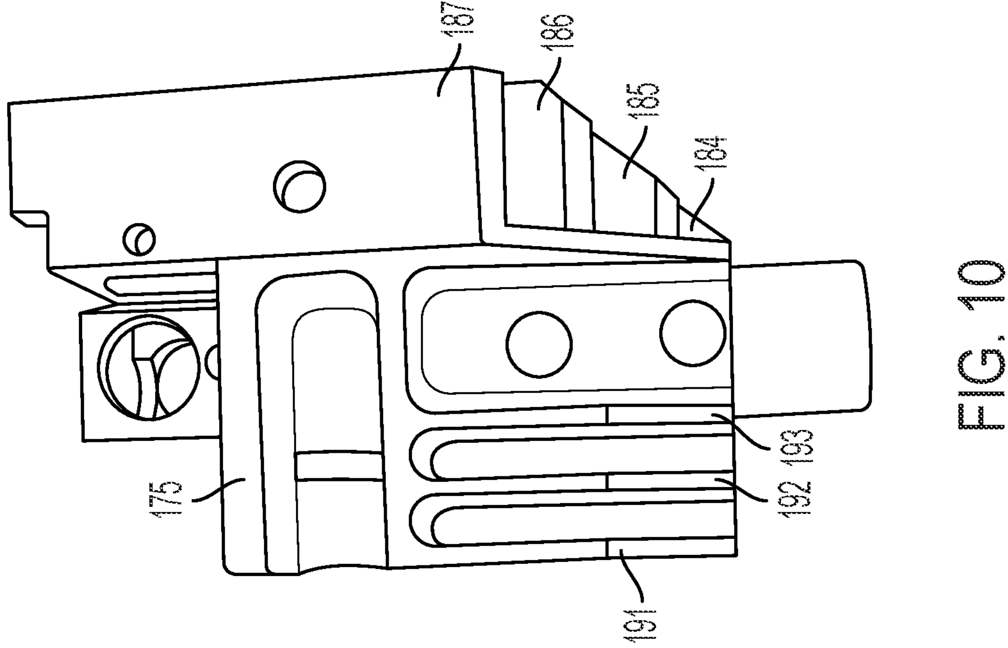
FIG. 10 is a fourth side view of an example embodiment of a laser mount.
Figure 9:
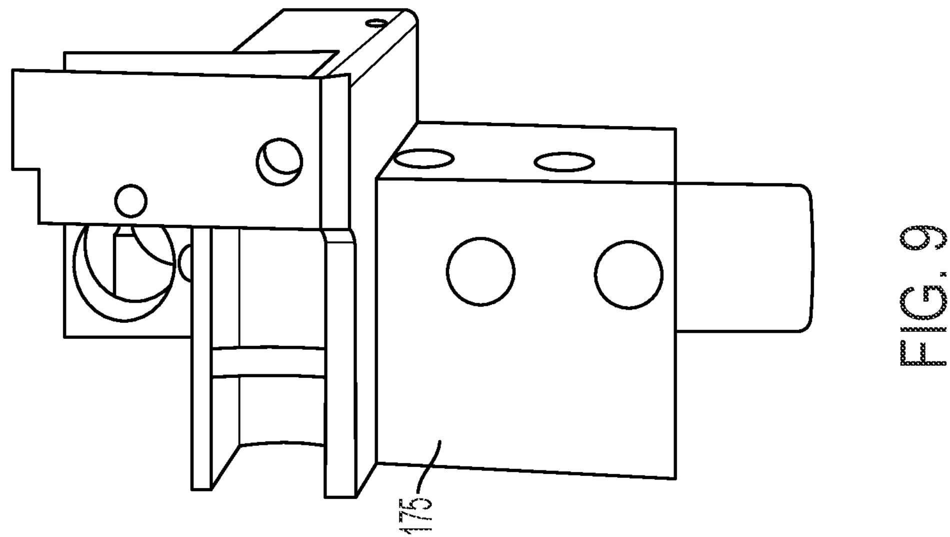
FIG. 9 is a third side view of an example embodiment of a laser mount.

FIGS. 7-10 illustrate various views of the laser mount 175. The laser mount 175 generally has four sides. FIG. 7 is a view from a first side, FIG. 8 is a view from a second side, FIG. 9 is a view from a third side and FIG. 10 is a view from a fourth side. As shown, the laser mount 175 includes a number of heat dissipating fins, collectively fins 180. The fins are particularly illustrated in the FIG. 8 view from the second side and the FIG. 10 view form the fourth side. The general shape of the fins 180 is shown in FIGS. 11 and 12.

Figure 12:
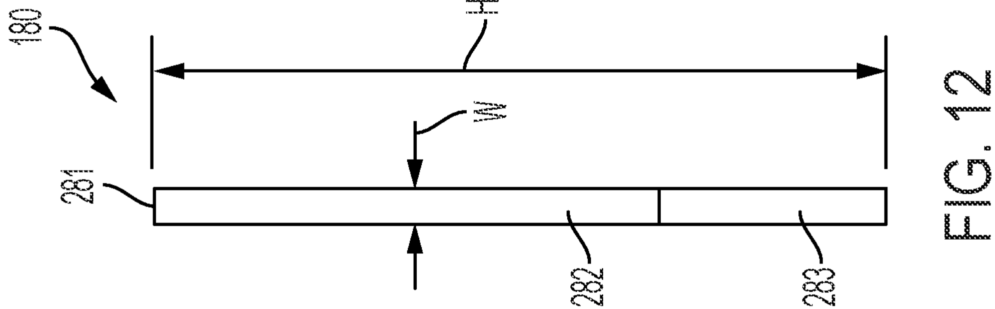
FIG. 12 is a front view of an example embodiment of a fin.
Figure 11:
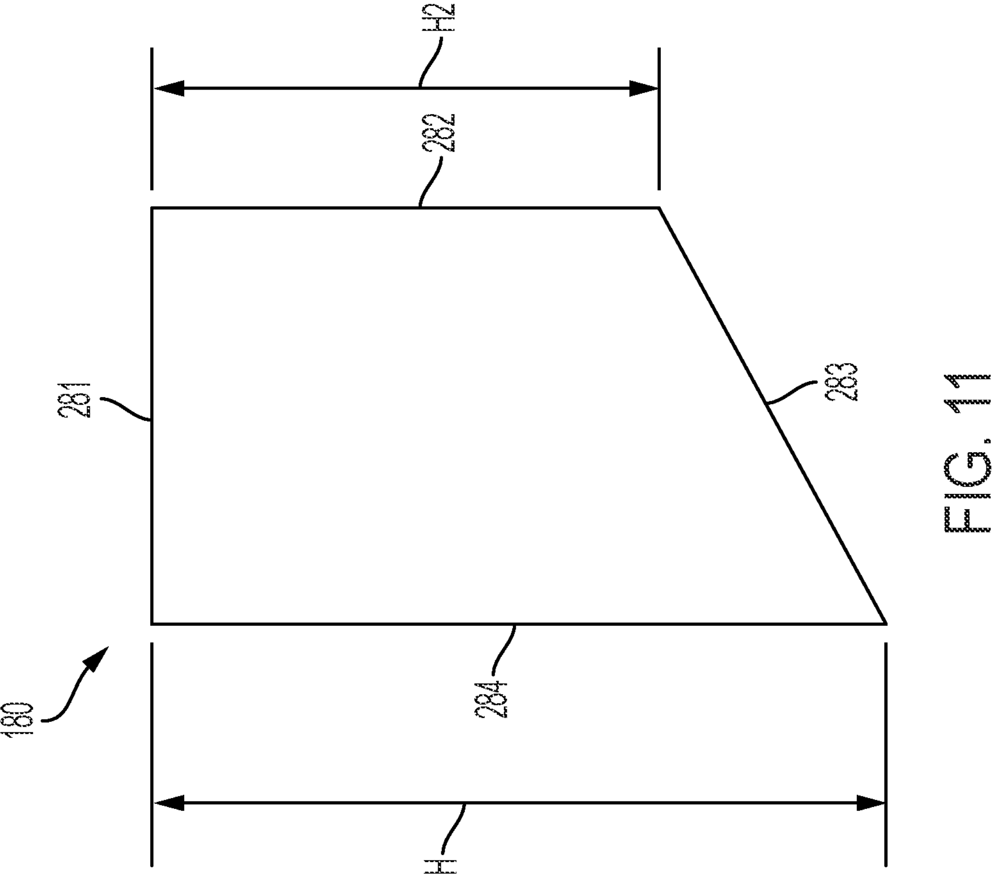
FIG. 11 is a side view of an example embodiment of a fin.

FIG. 11 is a side view and FIG. 12 is a front view of an exemplary fin 180. As shown in FIGS. 8-10, each particular fin 180 may vary in size. In the exemplary embodiment, all of the fins 180 are the same shape. In other embodiments, the fins 180 may be different shapes. The fins 180 include a top edge 281, and outward edge 282, an angled edge 283 and a laser mount side 284. The laser mount side 284 is where the fins 180 meet the rest of the laser mount 175. In the exemplary embodiment, the fins 180 are integrally formed with the rest of the laser mount 175. In other embodiments, the fins 180 may be attached at the edge 284 to a body of the laser mount 175. The fins 180 may be attached, for example, by an adhesive, welding, one or more fasteners, a combination of these or other methods of attachment.

As shown in FIGS. 11 and 12, the fins 180 have a height H, a width W and a length L. The height H is measured as the total height of the fin 180, in this case that is equal to the height of the fin at the laser mount side 284. The front of the fins 180 have a front height F that is shorter than the height H because of the angled portion 283.

The fins 180 may be relatively thin, tall and long so as to effectively disperse heat. For example, the fins 180 may have a length L that is at least two times as great as the width W, at least three times as great as the width W, or at least four times as great as the width W. Additionally, the fins 180 may have a height H that is at least two times as great as the width W, at least three times as great as the width W, or at least four times as great as the width W. The spaces between the fins 180 may be as at least as large as the width W, at least 1.5 times as great as the width or at least two times as great as the width. The length L of the fins may be at least 5 mm, at least 10 mm, at least 15 mm, at least 20 mm at least 25 mm or at least 30 mm. The width W and height H may be proportional as discussed above.

Furthermore, the height H2 may be at least 0.25 times the height H, at least 0.5 times the height H or at least 0.75 times the height H. The height H2 of the exemplary embodiment is less than the height H. In other embodiments, the height H2 may be equal to the total height and may be longer than the edge 284.

As shown in FIG. 8, the second side includes seven fins 180 of varying sizes including fins 181-187. Fins. 181, 182, 183 and 184 are the same size such that the dimensions H and F are the same for each of these fins 180. The fins 185, 186 and 187 are each progressively smaller such that the angled size 283 becomes almost entirely truncated for fin 187. As shown in FIG. 10, the fourth side includes fins 191, 192 and 193. The fins 191, 192 and 193 are the same size and shape as each other and are also the same size and shape as the fins 181-184. In other embodiments, the fins 191-193 may be different sizes and or shapes from one another and different sizes and shapes than the fins 181-184.

The fins 180 and 191, 192, 193 may be made of a heat dissipating material. The fins 180 and 191, 192, 193 may include metal. The fins 180 and 191, 192, 193 may include aluminum. The fins 180 and 191, 192, 193 may include a conductive material with a conductivity greater than 3 W/(mK); greater than 5 W/(mK); greater than 7 W/(mK); greater than 10 W/(mK); or greater than W/(mK). The fins 180 and 191, 192, 193 may include a plastic material. The fins 180 and 191, 192, 193 may include a composite material. Any of the plurality of fins may be made of different materials. For example, in an example embodiment, fin 181 and fin 191 may comprise different materials and fin 181 may include a composite material and fin 191 may comprise a plastic material.

One or more or all of the fins 180 and 191, 192, 193 may have a volume of at least 5 cubic millimeters ($mm^3$), at least 8 $mm^3$, at least 10 $mm^3$, at least 12 $mm^3$, at least 14 $mm^3$, at least 16 $mm^3$; at least 20 $mm^3$; or at least 30 $mm^3$. One or more or all of the fins 180 and 191, 192, 193 may have a volume of 1,000 mm 3 or less; 800 mm 3 or less; 600 mm 3 or less; 500 mm 3 or less; 300 mm 3 or less; 100 mm 3 or less; 90 mm 3 or less; 80 mm 3 or less; 70 mm 3 or less; or 50 mm 3 or less. In an example embodiment, one or more or all of the fins 180 and 191, 192, 193 may have a volume of between 5 mm 3 and 1,000 $mm^3$; between 5 mm 3 and 1,000 $mm^3$; between 10 mm 3 and 900 $mm^3$; between 12 mm 3 and 800 $mm^3$; or between 15 mm 3 and 200 $mm^3$.

The number of heat dissipating fins on the laser mount 175 may vary. In particular, there may be at least 2 fins, at least 3 fins, at least 4, at least 5 fins, at least 6 fins, at least 7 fins, at least 8 fins or at least 9 fins. There may be fewer than 30 heat dissipating fins, fewer than 25 fins, fewer than 20 fins or fewer than 15 fins. In an example embodiment, the number of fins may be, for example, between 3 fins and 30 fins; between 4 fins and 25 fins; between 5 fins and 20 fins; and between 6 fins and 15 fins.

The fourth side shown in FIG. 10 is adjacent to the second side shown in FIG. 8. In the exemplary embodiment, the first side shown in FIG. 7 and the third side shown in FIG. 9 do not have any projecting heat dissipating fins 180. In other example embodiments, there are heat dissipating fins on three or four sides of the laser mount.

Figures 13, 14:
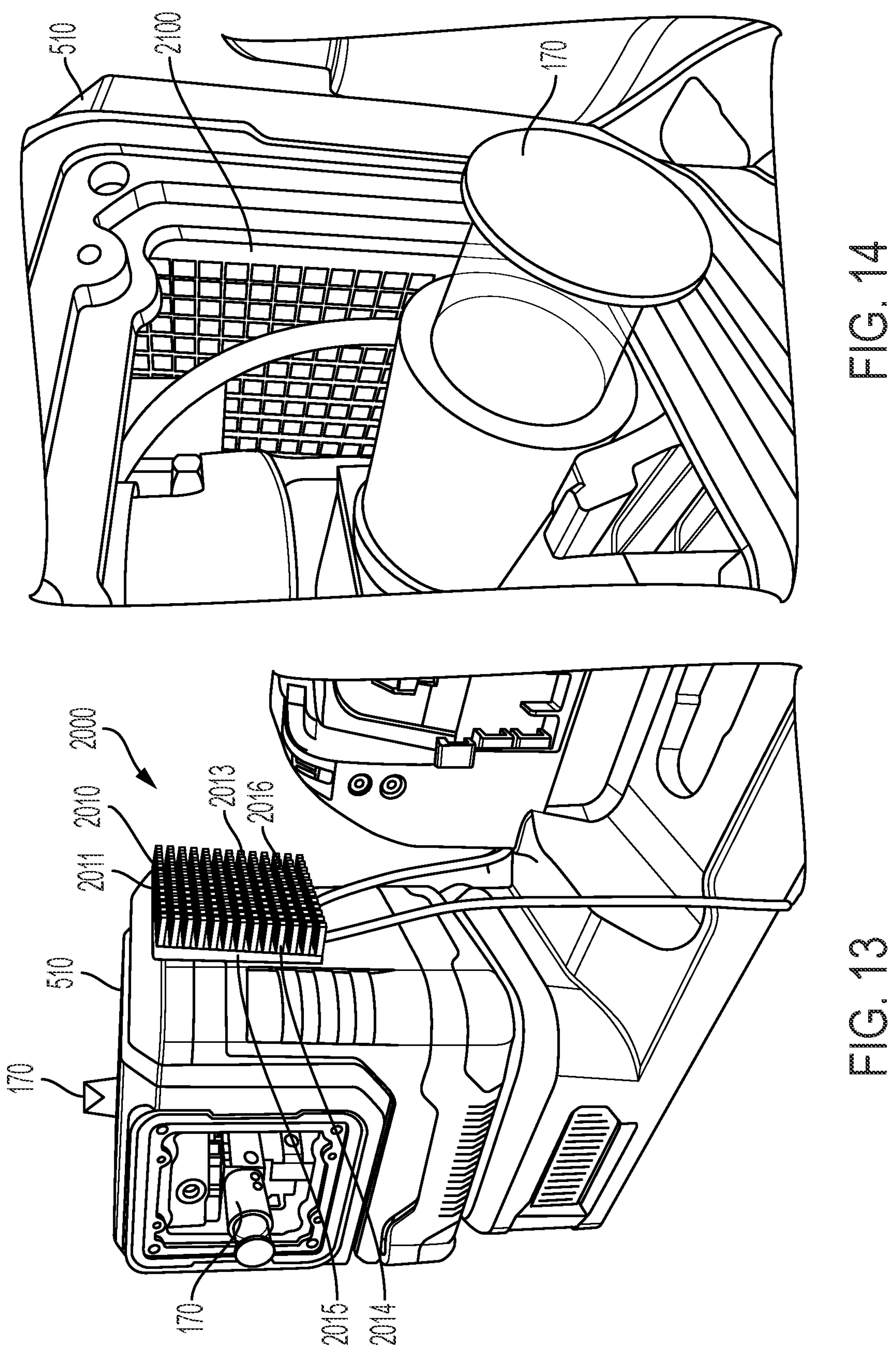
FIG. 13 is a perspective view of an example embodiment of a laser level including a thermoelectric cooler.
FIG. 14 is a close-up perspective view of an example embodiment of a laser level including a thermoelectric cooler.

FIGS. 13 and 14 illustrate a laser level with a thermoelectric cooler 2000. As shown in FIG. 13, the thermoelectric cooler 2000 may be at a side of the housing 510 of the laser level 500. As shown in FIGS. 13 and 14, the thermoelectric cooler may be on a side of the housing with a portion 2100 facing an inside of the housing 510 and an outwardly facing portion 2200. A portion of the laser level 550 is removed in FIGS. 13 and 14 such that the inwardly facing portion 2100 of the thermoelectric cooler 2000 can be seen in FIG. 14. This is done for illustrative purposes. It is contemplated that the housing 510 of the laser level is sealed to prevent liquid, moisture and debris from entering. The thermoelectric cooler 2000 is configured to dissipate heat from inside the housing.

The first portion 2100 of the thermoelectric cooler 2000 may be inside the housing 510 to various degrees and the second portion 2200 may be outside the housing to various degrees. For example, the first portion 2100 of the thermoelectric cooler may project into the housing 510 from a housing wall to various degrees. A greater degree of projection of the first portion 2100 into the housing 510 may allow for greater cooling. Limiting projection may allow for a more compact design and free from interference of the laser mount 175.

As shown, the thermoelectric cooler 2000 may comprise a plurality of fins 2010. The exemplary embodiment includes thirteen fins 2010. In other embodiments, there may be more or fewer fins 2010. In order to provide significant cooling, there may be in some embodiments at least five fins 2010, at least seven fins 2010 or at least ten fins 2010. The plurality of fins 2010 allows significant surface area for the dissipation of heat.

As shown, the fins 2010 may be relatively thin, tall and long so as to effectively disperse heat. The fins 2010 of the thermoelectric cooler shown in the exemplary embodiment have a different shape and size from the fins 180. In particular, the fins 2010 generally lack the angled edge 283 of the fins 180. Accordingly, the fins 2010 of the exemplary embodiment are generally plate shaped. In the exemplary embodiment shown, the fins have a generally rectangular plate shape, but other plate shapes are also contemplated. Having a generally plate shaped configuration allows for a large surface are through which heat may be dissipated.

The fins 2010 of the exemplary embodiment are disposed in rows horizontally. The fins 2010 may instead be arranged vertically like the fins 180. Similarly, the fins 180 may be arranged horizontally like the fins 2010. Additionally, there may be a combination of horizontal, vertical and angled fins. For example, the fins 2010 of the thermoelectric cooler 2000 may comprise vertical fins and horizontal fins or vertical and angled fins or only angled fins or any combination thereof.

Figure 26:
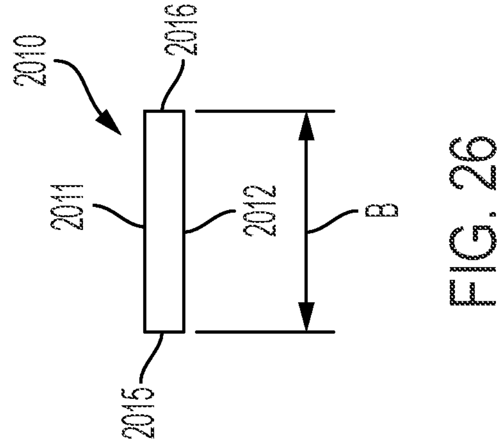
FIG. 26 is a side view of an example embodiment of fins.
Figure 25:
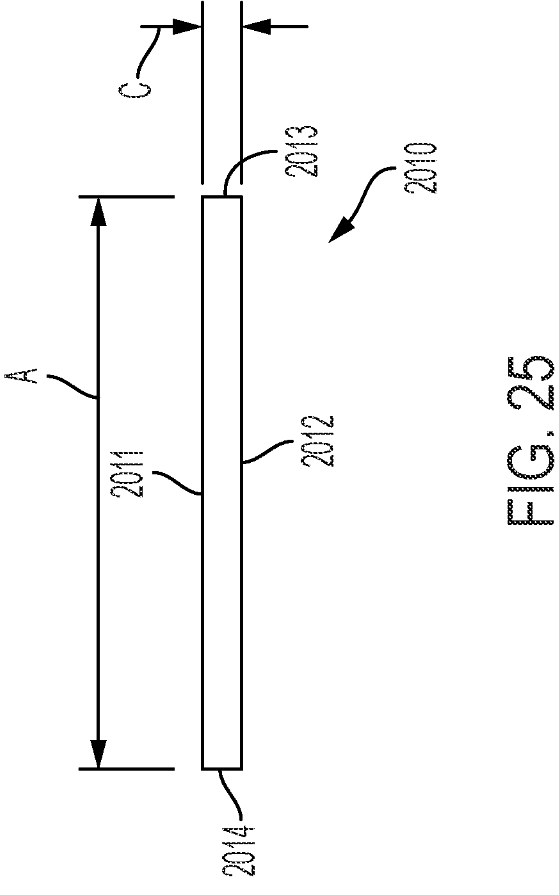
FIG. 25 is a front view of an example embodiment of fins.

FIG. 25 illustrates a front view of the fins 2010 and FIG. 26 illustrates a side view. As shown in FIGS. 25 and 26, the fins 2010 have a top surface 2011, a bottom surface 2012, a first end 2013, a second end 2014 opposite the first end 2013, an outward end 2016 an inward end 2015. As shown in FIG. 13, the inward end 2015 is the end of the fin 2010 closest to the housing 510 and the outward end 2016 is a free end at the far end of the thermoelectric cooler 2010.

As also shown in FIGS. 25 and 26, the fins have a first dimension A, a second dimension B and a third dimension C. The dimension A may be significantly longer than the dimension B and the dimension B may be significantly longer than the dimension C. For example, the dimension A may be at least 2 times as long as the dimension B, at least 3 times as long as the dimension B or at least 4 times as long as the dimension B. Also, the dimension B may be at least 1.5 times as large as the dimension C, at least 2 times as large as the dimension B, at least 3 times as large as the dimension B or at least 4 times as large as the dimension B.

The dimension A may be at least 30 mm, at least 40 mm, or at least 50 mm. The dimension B may be at least 5 mm, at least 10 mm, or at least 15 mm. The dimension C may be less than 15 mm, less than 10 mm or less than 5 mm. The dimension C may also be larger than 1 mm or larger than 2 mm.

The heat dissipating projections or fins may project at least 2 mm, at least 3 mm, at least 4 mm, at least 5 mm, at least 6 mm, at least 7 mm, at least 8 mm, at least 9 mm, or at least 10 mm. The heat dissipating projections or fins may projects less than 40 mm, less than 35 mm, less than 30 mm or less than 25 mm.

In some embodiments, the thermoelectric cooler 2000 fins 2010 may be at least partially inside the primary housing 510 or there may be additional fins 2010 such that there are fins inside and outside of the housing.

In the shown exemplary embodiment, the plurality of fins 2010 are parallel to one another and spaced apart from one another. The space between the fins 2010 may be at least 1 mm wide, at least 2 mm wide, at least 3 mm wide or at least 4 mm wide. The space may also be less than 15 mm wide or less than 10 mm wide. The spaces allow for passage of air to vent out.

Figure 27:
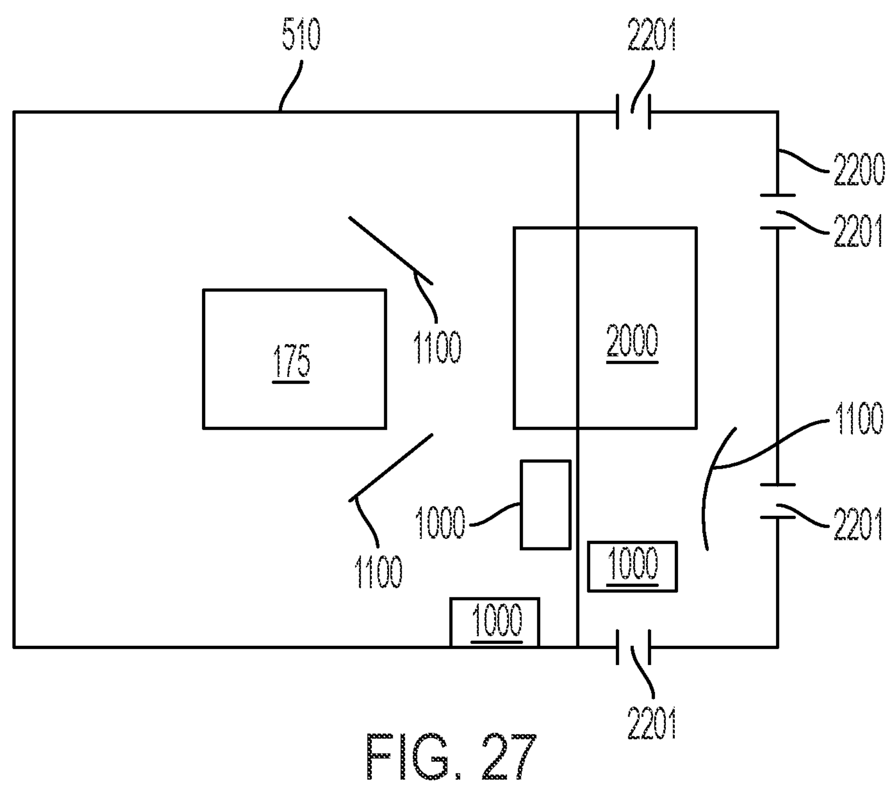
FIG. 27 is a schematic view of an example embodiment of a laser level including a secondary housing.

In some embodiments, there may be a secondary housing 2200 to cover the thermoelectric cooler 2000. This is shown schematically in FIG. 27. As shown in FIG. 27, the laser mount 175 and associated laser generating components are housed in the primary housing 510. The thermoelectric cooler 2000 communicates to the inside of the primary housing 510. As discussed above, the thermoelectric cooler 2000 may be partially in the housing 510 or form flush to a side of the housing 510. The schematic drawing of FIG. 27 illustrates the thermoelectric cooler 2000 partially projecting into the housing 510.

As shown in FIG. 27, the secondary housing 2200 may include vents 2201 to allow air to enter and exit the secondary housing 2200. There may be a plurality of vents 2201. The vents 2201 may be covered by an air permeable material or some other means for allowing air to flow in and out of the secondary housing. The secondary housing 2200 may provide a pleasing aesthetic as well as protect the thermoelectric cooler 2000 while still allowing a flow of air. The primary housing 510 may sealed more tightly than the secondary housing 2200 and may be generally water and/or air-tight. The primary housing may have a construction that allows it to be IP rated and prevent debris, moisture and other intrusions while the secondary housing may allow airflow as described above. This allows for the laser mount 175, laser diodes and other components internal to the housing 510 to be protected while allowing for dissipation of heat from the thermoelectric cooler 2000 as described above. The primary housing 510 may have a construction configured to allow an IP rating of 55 or better. The primary housing may have a construction configured to allow an IP rating of 56 or better. The primary housing may have a construction configured to allow an IP rating of 65 or better. The secondary housing 2200 may have a construction configured to allow an IP rating that is the same as or less than that allowed by the construction of the primary housing 510. The secondary housing 2200 may have a construction configured to allow an IP rating that is the less than that allowed by the construction of the primary housing 510.

As further shown in FIG. 27, there may be one or more baffles 1100 to direct the airflow. There may be baffles 1100 in the primary housing 510 in order to direct the airflow away from the laser mount 175 in order to limit the effects of the airflow on leveling of the laser mount 175. There may be baffles 1100 in the secondary housing to direct airflow through the thermoelectric cooler 2000 and, in particular, through the fins 2010 of the thermoelectric cooler 2000. In some exemplary embodiments, the baffles 1100 may be molded as part of the housing 510 or the housing 2200. In other embodiments, the baffles may be separately formed and attached.

As shown in FIG. 27, the primary housing 510 and secondary housing 2200 may allow for one or more fans 1000. There may be one or more fans 1000 in one of or both of the primary housing 510 and secondary housing 2200. As one example, the exemplary embodiment of FIG. 27 illustrates one fan 1000 in the secondary housing 2200 and two fans 1000 in the primary housing 510. The battery pack 550 may power the fans 1000 and the thermoelectric cooler 2000. Alternatively, the fans 1000 or the thermoelectric cooler 2000 or both may be powered by another power source such as a coin cell. One or both of the fans 1000 may provide a rated airflow of at least 0.5 cubic feet per minute (cfm); at least 1 cubic feet per minute; at least 2 cubic feet per minute; at least 3 cubic feet per minute; at least 4 cubic feet per minute; at least 5 cubic feet per minute; at least 7 cubic feet per minute; at least 8 cubic feet per minute; at least 9 cubic feet per minute; at least 10 cubic feet per minute; at least 11 cubic feet per minute; or at least 12 cubic feet per minute. One or both of the fans 1000 may provide a rated airflow of less than 40 cubic feet per minute (cfm); less than 30 cubic feet per minute (cfm); less than 25 cubic feet per minute (cfm) or less than 20 cubic feet per minute (cfm). In an example embodiment, it may be useful that the rated airflow of one or both of fans 1000 is less than a certain amount so that the airflow does not disturb leveling of the laser mount.

In an example embodiment, one or more fan may provide a rated air flow in a range of 2 to 5 cubic feet per minute; a range of 2.5 to 4.5 cubic feet per minute; or a range of 3 to 4 cubic feet per minute. In an example embodiment, air flow in these ranges provide for an efficient cooling effect that helps to avoid excessive heat buildup from the one or more laser generators and so as to limit or prevent damage to one or more components of the laser level. Additionally, air flow in these ranges is not as to excessively disturb leveling of the laser mount.

Figures 15, 16:
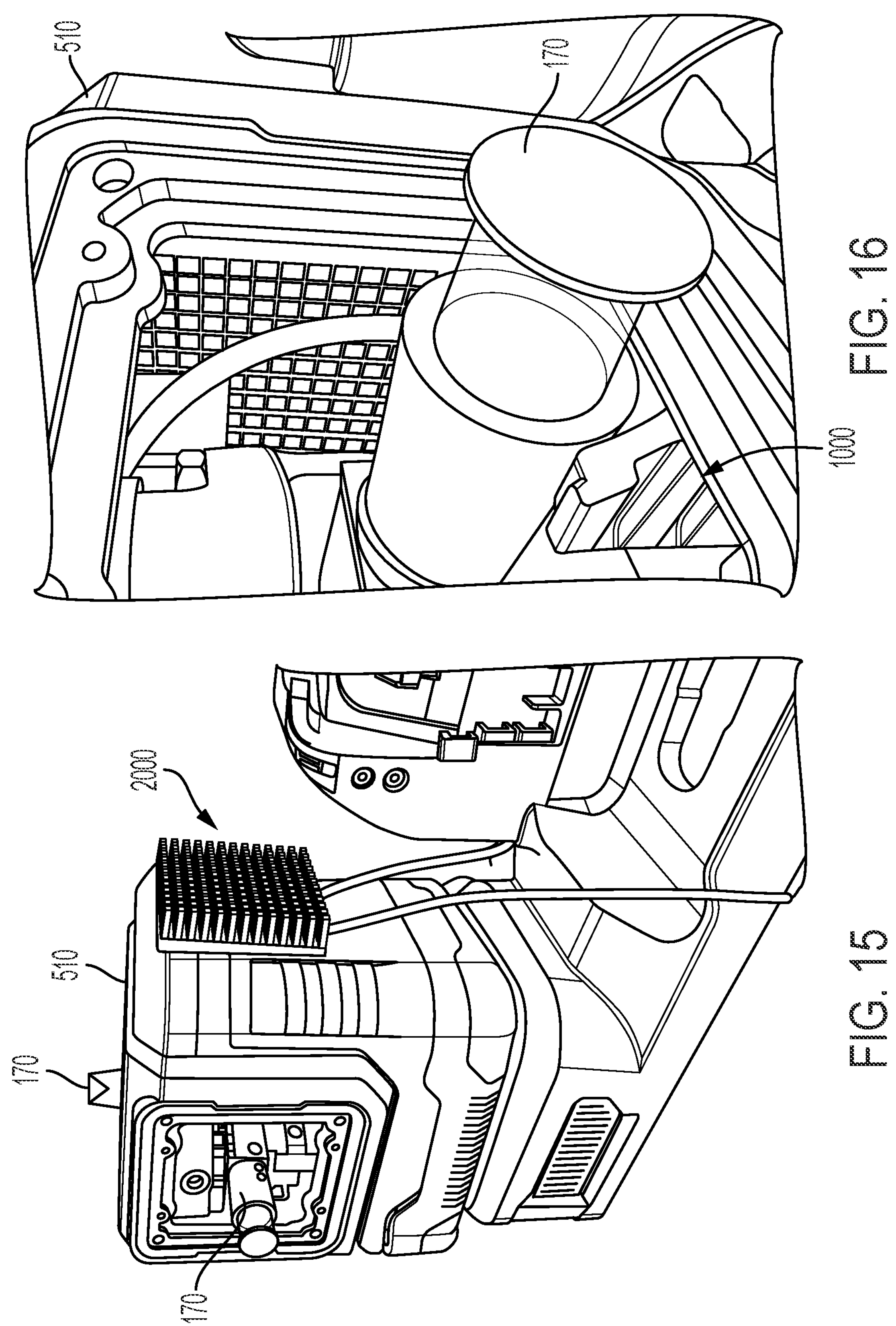
FIG. 15 is a perspective view of an example embodiment of a laser level including a thermoelectric cooler and an internal fan.
FIG. 16 is a close-up perspective view of an example embodiment of a laser level including a thermoelectric cooler and an internal fan.

FIGS. 15 and 16 illustrate a laser level with a thermoelectric cooler and an internal fan. The laser level of FIGS. 15 and 16 is otherwise similar to the laser level of FIGS. 13 and 14. The internal fan 1000 helps to circulate air cooled by the thermoelectric cooler 2000. The combination allows for air to be cooled and then circulated.

In the exemplary embodiment, the laser may include one or more fans. There may be a fan in the housing 510. There may additionally or alternatively be a fan 1000 inside the secondary housing described above that would house a portion of the thermoelectric cooler 2000. The fans may be completely inside either the housing 510 or the secondary housing or may be partially inside the housings and may form an outside surface of one or both of the housings.

Figure 17:
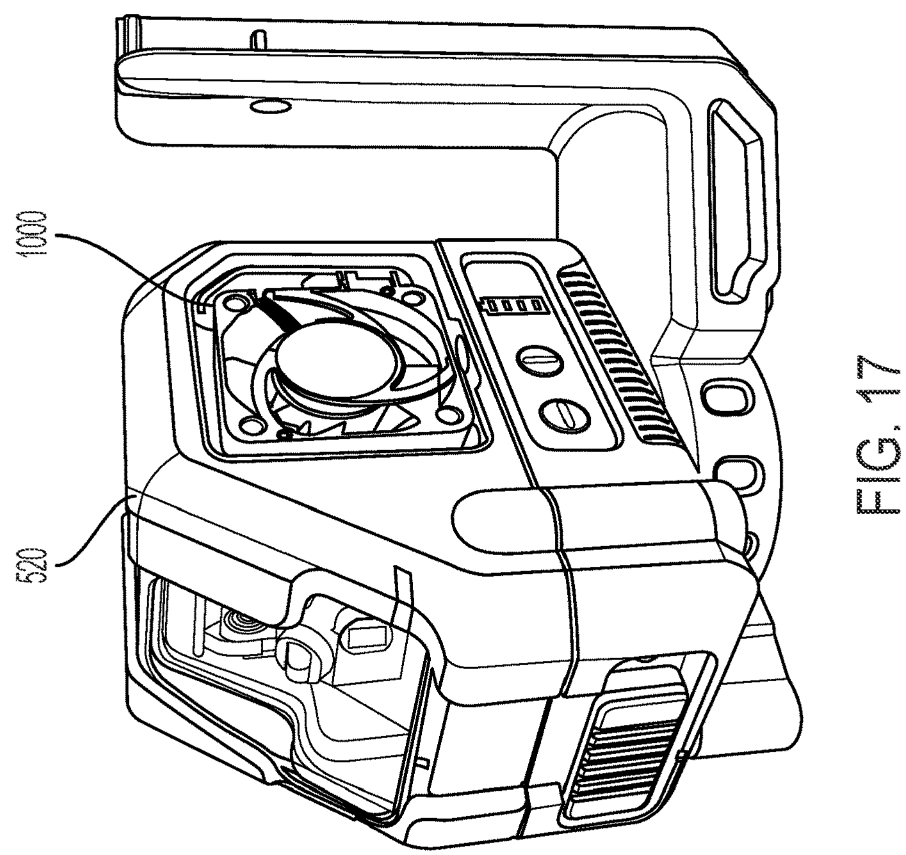
FIG. 17 is a side perspective view of an example embodiment of a laser level including a fan.

FIG. 17 illustrates a laser level with a fan 1000. In the exemplary embodiment, the fan blows ambient outside air into the interior or vice-versa. In other embodiments, the fan may be an internal fan in a sealed housing. The laser level of FIG. 17 is a cross-line laser level and has a housing 520 similar to the housing 510, but adapted for a cross-line laser level.

Figure 18:
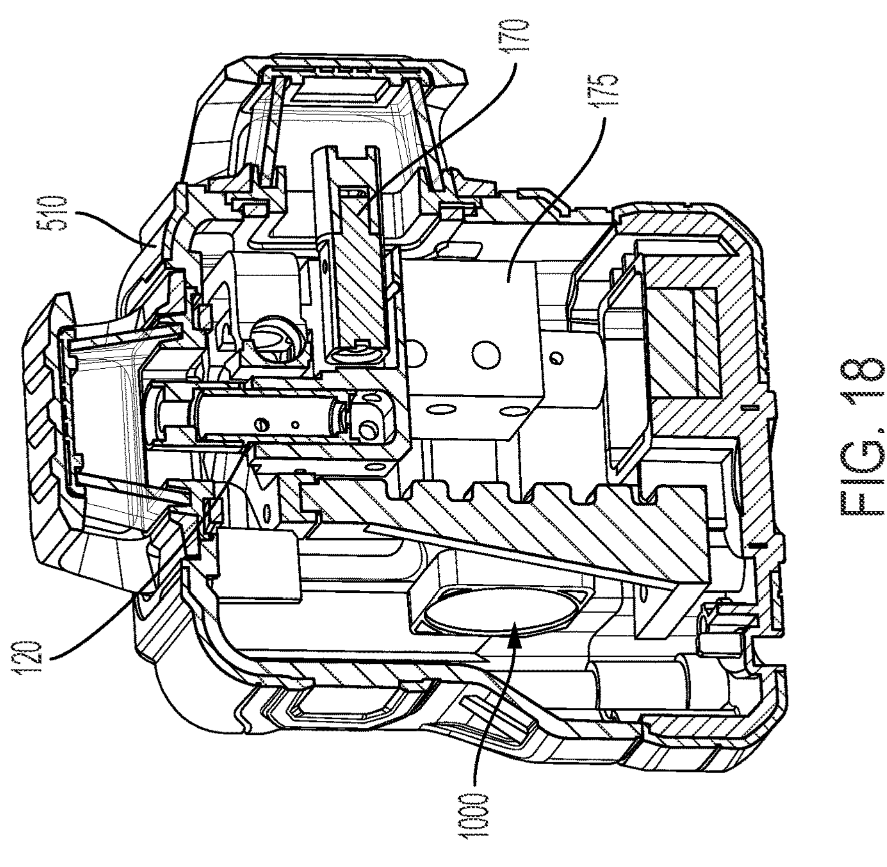
FIG. 18 is a cross-sectional side view of an example embodiment of a laser level including a fan.
Figure 20:
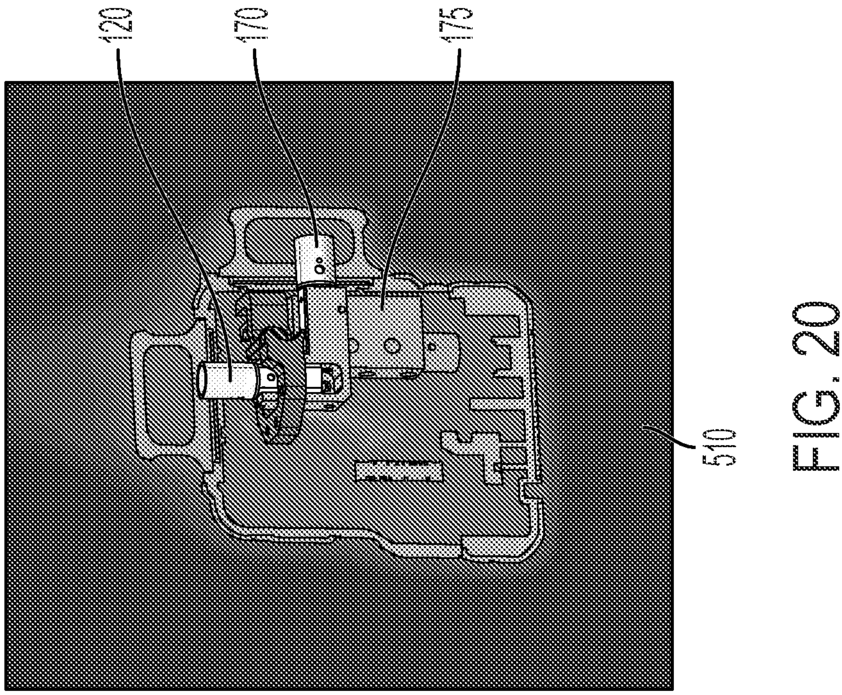
FIG. 20 is a view of internal airflow of an example embodiment of a laser level.
Figure 19:
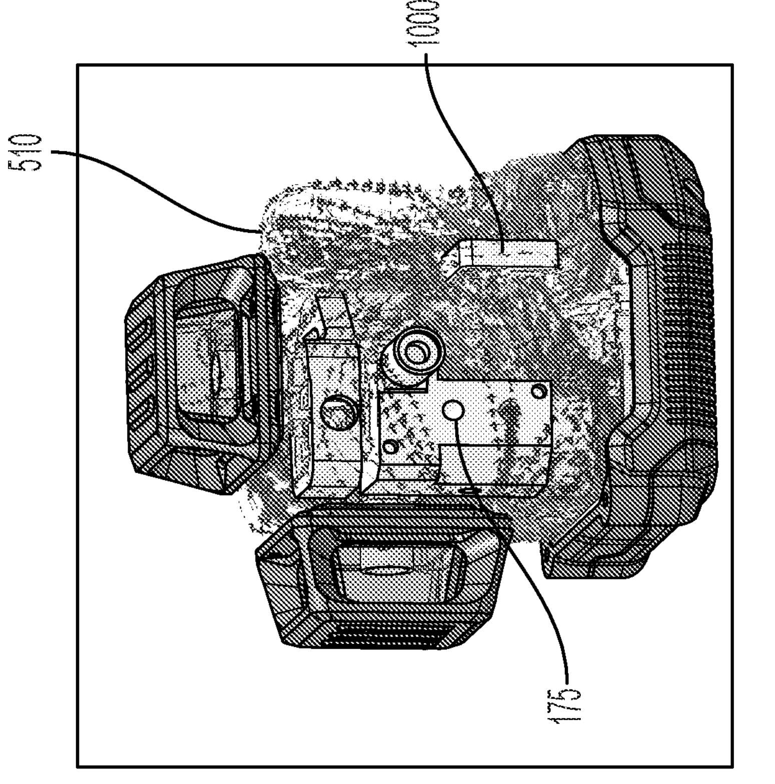
FIG. 19 is a view of internal airflow of an example embodiment of a laser level.

FIGS. 18-20 show internal airflow from an internal fan 1000. In the exemplary embodiment of FIGS. 18-20, the housing is sealed.

Figure 21:
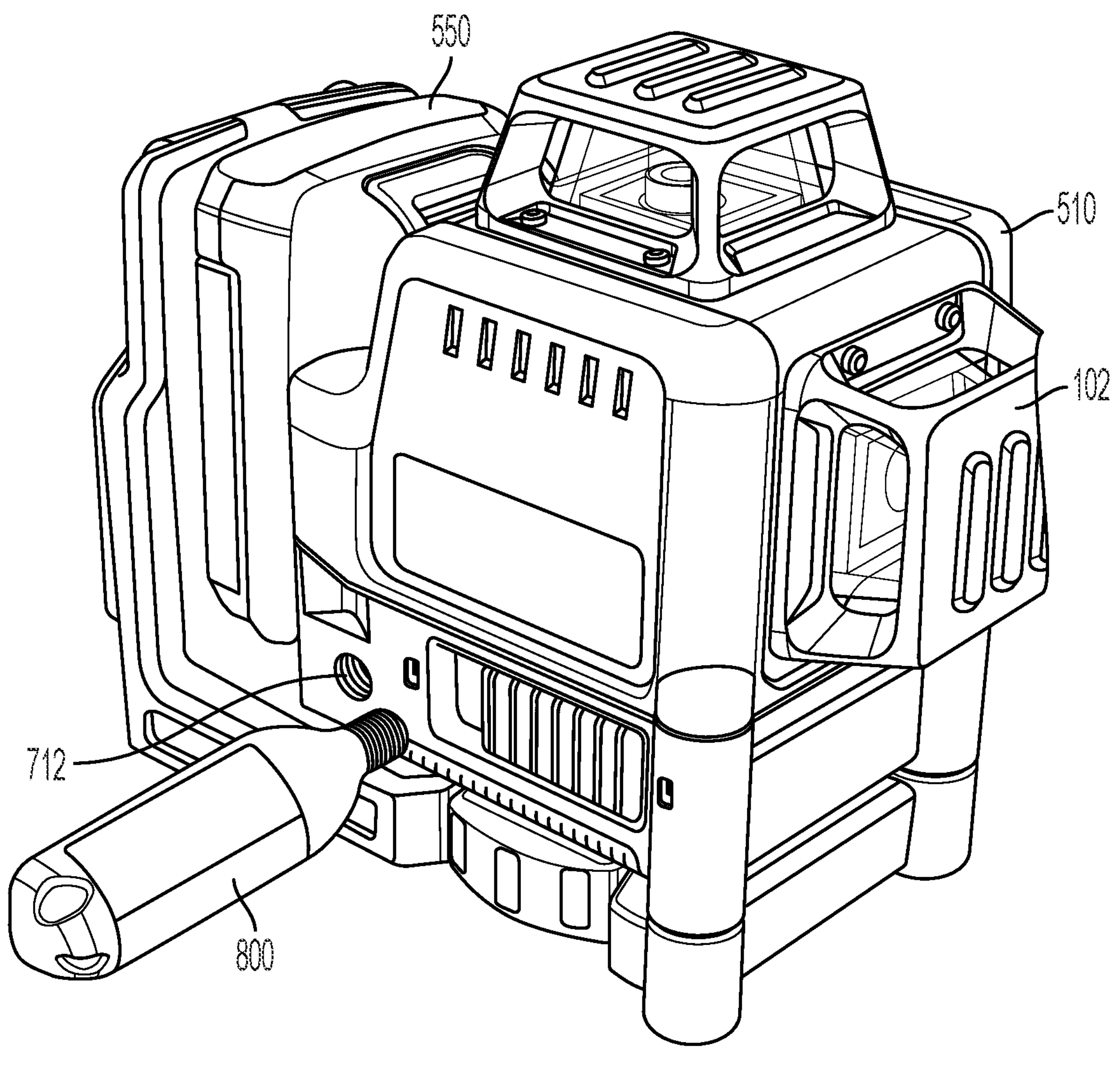
FIG. 21 is a perspective view of an example embodiment of a laser level configured to receive a fluid.

FIG. 21 illustrates an embodiment that uses a fluid containing cartridge 800 to inject a fluid into the interior of the laser level and cool the interior of a laser level. The fluid may be a gas. In the example embodiment, the fluid may be carbon dioxide. In other example embodiments, the fluid may be a liquid. The fluid may include at least one of carbon dioxide, nitrogen, argon, helium and neon.

In the example embodiment, a port 712 is provided in housing 510. In normal operation, the port 712 remains closed and does not allow air into or out of the housing 510. When an interior temperature of the housing 510 reaches a threshold, a user may insert CO2 cartridge into the port 712. The user may then discharge the CO2 cartridge into the port. The expanding gas provides a cooling effect that decreases the interior temperature in the housing 510. Accordingly, an interior temperature can be lowered and prevent damage or decreased output power.

Figure 22:
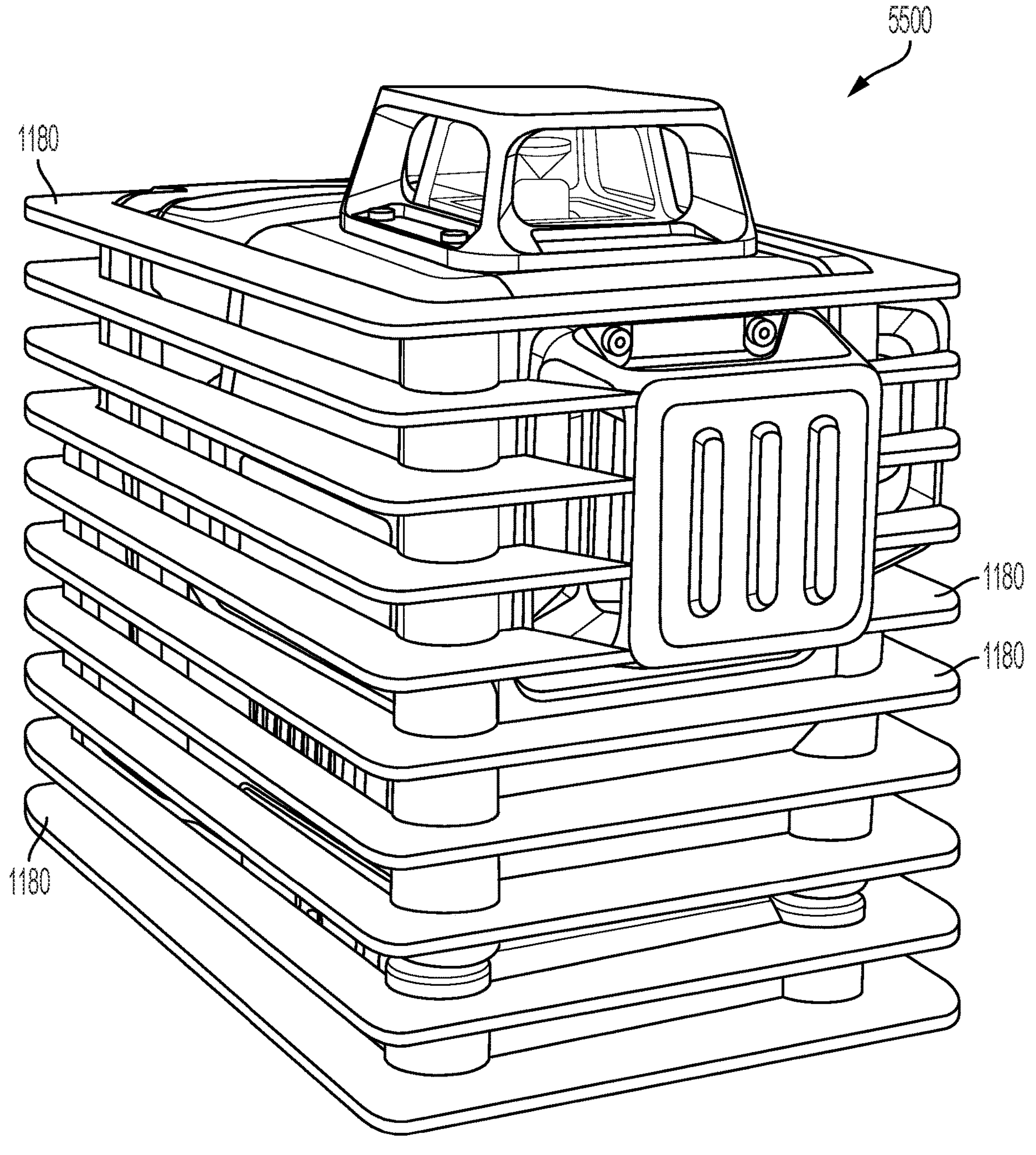
FIG. 22 is a perspective view of an example embodiment of a laser housing including heat dissipating projection on an exterior thereof.

FIG. 22 illustrates an exemplary embodiment of a laser housing 5500 including heat dissipating projections 1180 on an exterior thereof. The fins 1180 may include a metal material such as aluminum. The fins 1180 may include a plastic material. There may be a plurality of fins 1180, including at least 3 fins 1180, at least 4 fins, 1180 or at least 5 fins 1180. The fins may include features of the variety of other heat dissipating fins described herein. The fins 1180 may extend from an interior of the laser housing 5500 to an exterior of a laser housing 5500 in order to help moderate an interior temperature of the housing 5500. The laser housing 5500 may house laser module assembly 160 or other laser module assemblies.

Figure 23:
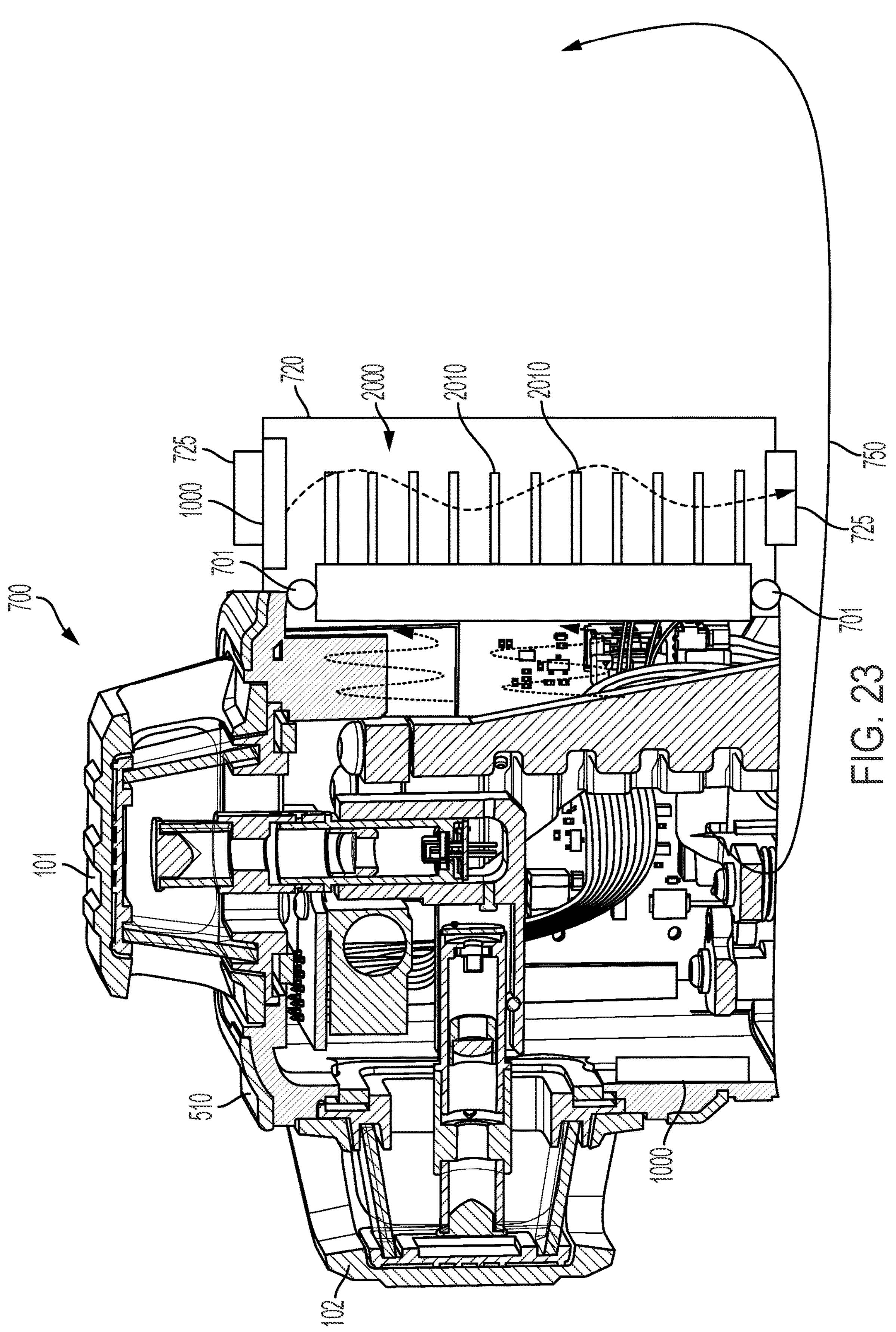
FIG. 23 is a side cross-sectional view of an example embodiment of a laser level including a convective heat sink.

FIG. 23 illustrates an exemplary embodiment of a laser level 700 including a convective heat sink. As shown in FIG. 23, a fan 1000 may be placed in the interior of the laser level housing 510 to promote airflow within the housing 510. A thermoelectric cooler 2000 may form part of a rear wall of the laser level housing 510. A seal member 701 may be placed between the thermoelectric cooler 2000 and another wall or portion of the housing 510. The seal 701 may include a material that is compressible in order to provide an air-tight and/or water tight seal and prevent air, dust, debris or liquid from entering the housing 510. The seal 701 may include, for example, a rubber or plastic material. The thermoelectric cooler 2000 has a number of heat dissipating fins 2010 projecting outwardly. The laser level 700 may also include a fan 1000 adjacent to the fins 2010 and configured to provide airflow across the fins 2010. The fins 2010 may be housed in a secondary housing 720. The secondary housing 720 may include one or more vents 725 for allowing air to enter and exit. Cables/wires 750 may pass through a bottom of the housing 510 to a power source such as a battery. The cables/wires may provide an electrical connection for passing power and/or information.

Figure 24:
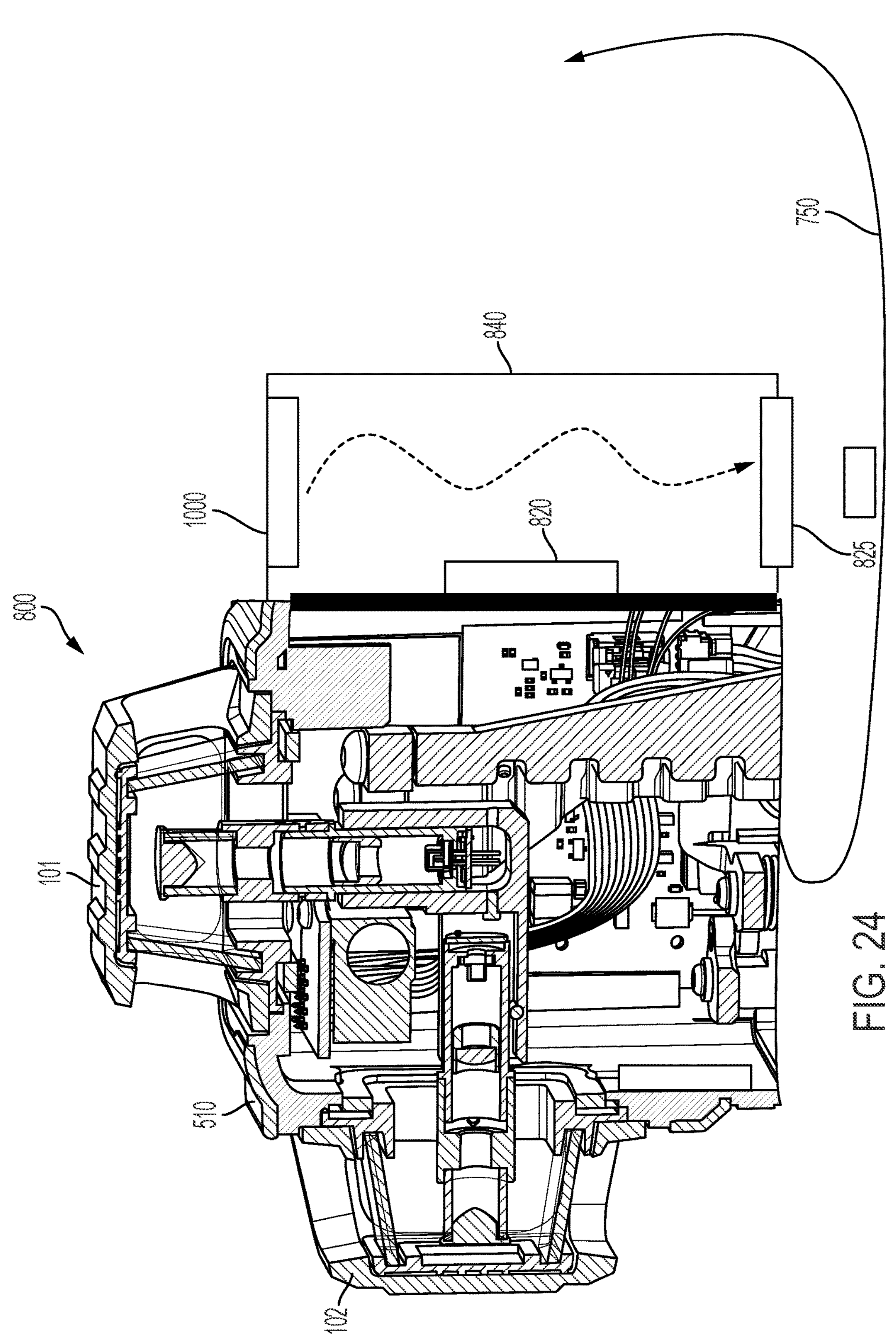
FIG. 24 is a side cross-sectional view of an example embodiment of a laser level including a vented interior.

FIG. 24 illustrates an exemplary embodiment of a laser level 800 including a vented interior. As shown in FIG. 24, a vent 820 may be provided on a rear wall of the housing 510 of the laser level 800. A fan 1000 may be provided on a secondary housing 840. The secondary housing 820 may include one or more vents for allowing air to enter and exit. Cables/wires may pass through a bottom of the housing 510 to a power source such as a battery. The cables/wires 750 may provide an electrical connection for passing power and/or information.

Figure 28:
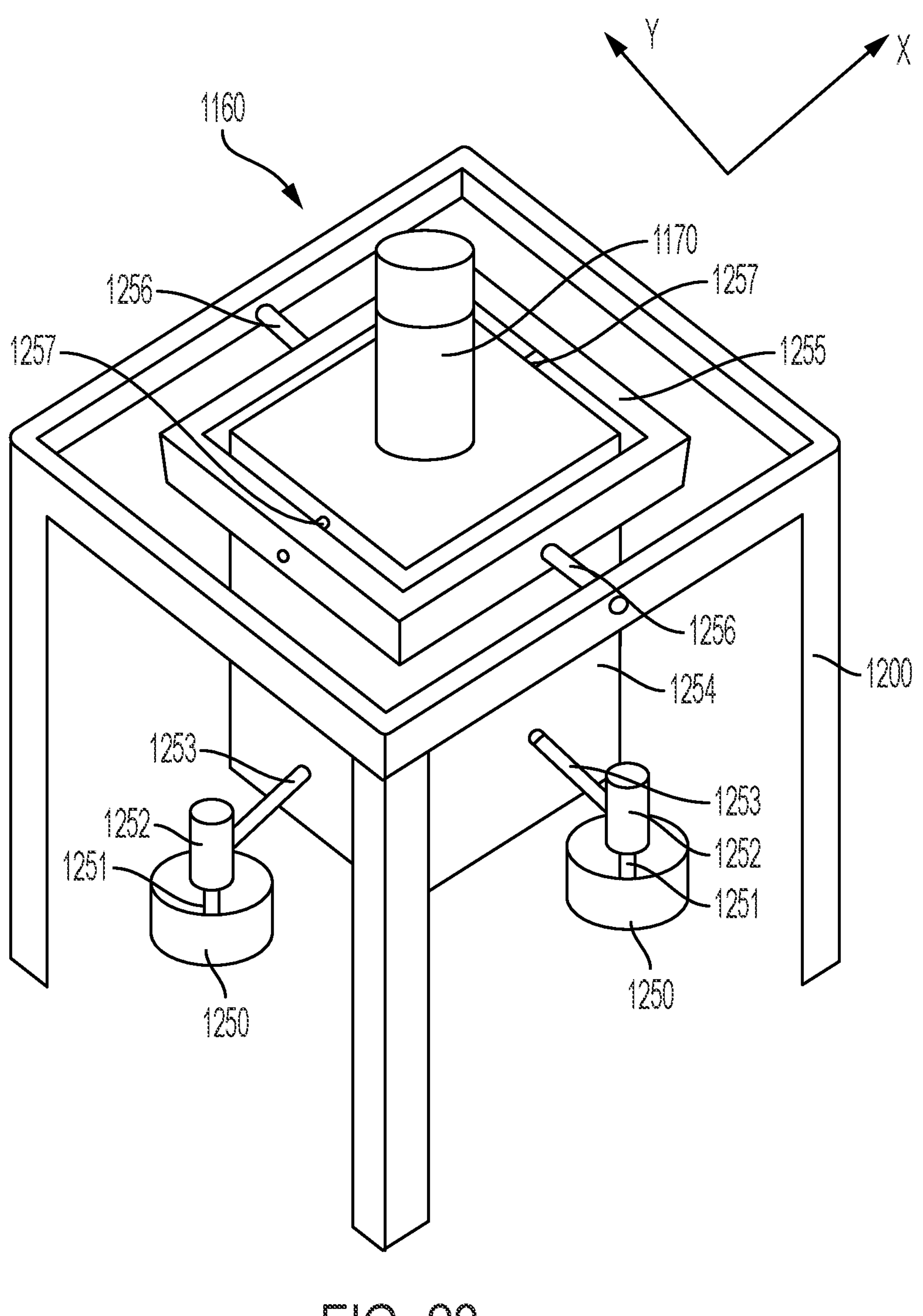
FIG. 28 is an example embodiment of an actively leveled laser mount.

FIG. 28 illustrates an example embodiment of an actively leveled laser mount for a laser module assembly 1160. The actively leveled laser mount laser module assembly 1160 may be utilized in any of the various embodiments of laser levels described. The laser module assembly 1160 includes a stand 1200. The stand 1200 may be secured to an inside of a laser level housing. A laser mount 1254 is movably mounted on the stand 1254. In particular, the laser mount 1254 may rotate about two axes defined by pins 1256 and 1257. As shown, there is a pendulum frame 1255 between the stand 1200 and the laser mount 1254 to facilitate rotation. A laser module 1170 is on the laser mount 1254. The laser module may include a laser generator and a reflector such as a cone reflector. The laser generator may include a laser diode. The laser generators may include a diode-pumped solid-state lasers (DPSSL). In the example embodiment of FIG. 28, there is one laser module 1170. In other embodiments, there may be more than one laser module 1170, such as two, three, four or more laser modules 1170.

As shown in FIG. 28, the laser module assembly 1160 includes two motors 1250. Each motor has a motor output shaft 1251. The motor output shafts 1251 are attached to a rotation to translation part 1252 that converts rotational motion from the motor output shaft to a translation of actuation pins 1253. In the example embodiment, the rotation to translation parts 1252 may be lead screws. When one of the motors 1250 is operated, rotational motion from the motor is converted to translational motion to move the actuator pins 1253 forward or backward. In turn, the actuator pints 1253 push and pull the laser mount 1254. Operation of one motor 1250 pivots the laser mount about the axis formed by pins 1256 and operation of the other motor 1250 pivots the laser mount about the axis formed by pins 1257. The pivots allows two-degrees of freedom. That is, the laser mount 1254 can rotate about an x-axis and a y-axis.

Sensors may be mounted on the laser mount opposite the motors 1250. The sensors may be connected to a controller. The sensors sense an orientation of the laser mount 1254. The controller can then control the motors 1250 to move the laser mount 1254 to an appropriate orientation. For example, the controller can control the motors 1250 to ensure that an output from the laser module 1170 produces a horizontal line. For example, if the laser level is placed on an unleveled surface, the motors 1250 may compensate so that the laser module 1170 produced a horizontal line even if the surface on which the laser level is placed is not perfectly horizontal.

Heat dissipating fins may be provided for on the laser module assembly 1160. For example, fins 180 or any of the other heat-dissipating fins discussed in the various example embodiments of the present application may be provided one or more surface of the laser mount 1254. The fins may be provided on one or more surface, two or more surfaces, three or more surfaces or four or more surfaces of the laser mount 1254. Fins may also be provided on other surfaces, for example, the stand 1200.

The laser generators of the various embodiments as well as the motor of the rotary laser level may be powered by a power source such as a battery. The battery may be a removable battery pack or an integral battery. The removable battery pack may a power tool battery pack that can be used to power other tools such as drills, saws, sanders and the like. The battery or batteries may be rechargeable or replaceable.

Various methods may be carried out involving the use of construction laser levels according to exemplary embodiments of the present application.

Features of the various embodiments may be combined when possible, as is understood by one of ordinary skill in the art. For example, a fan described in one embodiment may be utilized with other embodiments. As another example, the laser mount with fins 180 described with respect to FIGS. 5-12 may be used in any of the variety of embodiments.

Additionally, the features of the laser levels described above may be used with any of a variety of different laser levels. For example, the fins 180 are illustrated with respect to a laser mount for a 3×360 laser as shown in FIG. 4. Fins 180 could similarly be used on a laser mount for a cross-line laser level, a spot laser level or a combination line and spot laser level. The fans and thermoelectric cooler could likewise be implemented on a variety of laser levels including spot, line, and combination spot and line laser levels.

While the invention has been described by way of exemplary embodiments, it is understood that the words which have been used herein are words of description, rather than words of limitation. Additionally, it is understood that various features of the different embodiments may be combined. Changes may be made within the purview of the appended claims, without departing from the scope and spirit of the invention in its broader aspects.

What is claimed is:

1. A construction laser level, comprising:

a housing;

a laser mount disposed in the housing; and at least one laser generator on the laser mount, wherein the at least one laser generator is configured to project a first line and a second line outside of the housing onto a surface, and wherein the first line is transverse to the second line;

wherein the laser mount comprises a plurality of heat dissipating projections.

2. The construction laser level of claim 1, wherein the laser mount comprises at least three heat dissipating projections.

3. The construction laser level of claim 1, wherein the plurality of heat dissipating projections comprises a first set of heat dissipating projections projecting in a first direction and a second set of heat dissipating projections projecting in a second direction.

4. The construction laser level of claim 3, wherein the first direction is transverse to the second direction.

5. The construction laser level of claim 1, wherein the plurality of heat dissipating projections comprises first heat dissipating projections projecting in a first direction, second heat dissipating projections projecting in a second direction, and third heat dissipating fins projecting in a third direction; wherein the first direction is transverse to the second direction.

6. The construction laser level of claim 1, wherein the laser mount comprises a conductive material with a conductivity greater than 5 W/(mK).

7. The construction laser level of claim 1, further comprising a fan configured to circulate air inside the housing; wherein the fan is configured to provide rated airflow in a range of 2.5 to 4.5 cubic feet per minute.

8. The construction laser level of claim 1, further comprising a thermoelectric cooler; wherein the thermoelectric cooler is configured to cool air inside the housing.

9. The construction laser level of claim 1, further comprising a fan configured to circulate air inside the housing;

a thermoelectric cooler configured to cool air inside the housing;

a port in the housing configured to allow a fluid to be injected into the housing;

wherein the plurality of heat dissipating projections comprise first heat dissipating projections projecting in a first direction and a second heat dissipating projections projecting in a second direction, wherein the first direction is transverse to the second direction;

further comprising a plurality of external heat dissipating projections extending externally from the housing;

wherein the laser mount comprises a conductive material with a conductivity greater than 5 W/(mK); and wherein the fan is configured to provide rated airflow in a range of 2.5 to 4.5 cubic feet per minute.

10. A construction laser level, comprising:

a primary housing;

a laser mount disposed in the primary housing;

a laser generator associated with the laser mount, wherein the laser generator is configured to project a laser beam outside of the primary housing, wherein the laser generator is configured to project a first line and a second line outside of the primary housing onto a surface, and wherein the first line is transverse to the second line;

a thermoelectric cooler;

wherein the thermoelectric cooler is configured to dissipate heat from inside the primary housing.

11. The construction laser level of claim 10, wherein a first portion of the thermoelectric cooler is inside the primary housing and a second portion of the thermoelectric cooler is outside the primary housing.

12. The construction laser level of claim 11, further comprising a secondary housing, the secondary housing surrounding at least a portion of the thermoelectric cooler.

13. The construction laser level of claim 12, further comprising a fan configured to circulate air in at least one of the primary housing and the secondary housing.

14. The construction laser level of claim 13, wherein the fan is at least partially in the secondary housing.

15. The construction laser level of claim 10, further comprising a plurality of heat dissipating projections projecting from the laser mount; wherein the plurality of heat dissipating projections project at least 3 mm.

16. A construction laser level, comprising:

a housing;

a laser mount disposed in the housing;

at least one laser generator associated with the laser mount, the at least one laser generator configured to produce a laser beam;

a fan configured to circulate air inside the housing;

wherein the construction laser level is configured to project a first line and a second line outside of the housing onto a surface, wherein the first line is transverse to the second line; and wherein the fan is configured to provide rated airflow in a range of 2 to 5 cubic feet per minute.

17. The construction laser level of claim 16, wherein the fan is configured to provide rated airflow in a range of 2.5 to 4.5 cubic feet per minute.

18. The construction laser level of claim 16, further comprising a plurality of heat dissipating projections projecting from the laser mount; wherein the plurality of heat dissipating projections project at least 3 mm.

19. The construction laser level of claim 1, wherein the plurality of heat dissipating projections is integral to the laser mount.

20. The construction laser level of claim 10, wherein the thermoelectric cooler is disposed inside the primary housing and thermally coupled to the laser generator, the thermoelectric cooler being configured to dissipate the heat from inside the primary housing generated by the laser generator.

* * * * *